(12) United States Patent
Purayath et al.

(10) Patent No.: US 11,217,600 B2
(45) Date of Patent: Jan. 4, 2022

(54) PROCESS FOR A 3-DIMENSIONAL ARRAY OF HORIZONTAL NOR-TYPE MEMORY STRINGS

(71) Applicant: SUNRISE MEMORY CORPORATION, Fremont, CA (US)

(72) Inventors: Vinod Purayath, Sedona, AZ (US); Wu-Yi Henry Chien, San Jose, CA (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 0 days.

(21) Appl. No.: 16/924,531

(22) Filed: Jul. 9, 2020

(65) Prior Publication Data

US 2021/0013224 A1    Jan. 14, 2021

Related U.S. Application Data

(60) Provisional application No. 62/872,174, filed on Jul. 9, 2019.

(51) Int. Cl.
*H01L 27/105*  (2006.01)
*H01L 27/11578*  (2017.01)
(Continued)

(52) U.S. Cl.
CPC .. *H01L 27/11578* (2013.01); *H01L 21/76877* (2013.01); *H01L 27/11565* (2013.01);
(Continued)

(58) Field of Classification Search
CPC ........... H01L 27/1052; H01L 27/10844; H01L 27/11; H01L 27/112; H01L 27/115
See application file for complete search history.

(56) References Cited

U.S. PATENT DOCUMENTS

| 5,583,808 | A | 12/1996 | Brahmbhatt |
| 5,646,886 | A | 7/1997 | Brahmbhatt |

(Continued)

FOREIGN PATENT DOCUMENTS

| TW | 201712906 A | 4/2017 |
| WO | 2018236937 A1 | 12/2018 |

OTHER PUBLICATIONS

"EP Extended Search Report EP168690149.3", dated Oct. 18, 2019.
(Continued)

*Primary Examiner* — Mohammad M Choudhry
(74) *Attorney, Agent, or Firm* — Edward C. Kwok; VLP Law Group, LLP

(57) ABSTRACT

In the highly efficient fabrication processes for HNOR arrays provided herein, the channel regions of the storage transistors in the HNOR arrays are protected by a protective layer after deposition until the subsequent deposition of a charge-trapping material before forming local word lines. Both the silicon for the channel regions and the protective material may be deposited in amorphous form and are subsequently crystallized in an anneal step. The protective material may be silicon boron, silicon carbon or silicon germanium. The protective material induces greater grain boundaries in the crystallized silicon in the channel regions, thereby providing greater charge carrier mobility, greater conductivity and greater current densities.

33 Claims, 19 Drawing Sheets

(51) Int. Cl.
  *H01L 27/11565* (2017.01)
  *H01L 27/11568* (2017.01)
  *H01L 29/792* (2006.01)
  *H01L 21/768* (2006.01)
  *H01L 29/66* (2006.01)
  *H01L 21/28* (2006.01)

(52) U.S. Cl.
  CPC .. *H01L 27/11568* (2013.01); *H01L 29/40117* (2019.08); *H01L 29/66833* (2013.01); *H01L 29/7926* (2013.01)

(56) References Cited

U.S. PATENT DOCUMENTS

| | | | |
|---|---|---|---|
| 5,768,192 A | 6/1998 | Eitan | |
| 6,040,605 A | 3/2000 | Sano et al. | |
| 6,130,838 A | 10/2000 | Kim et al. | |
| 6,434,053 B1 | 8/2002 | Fujiwara | |
| 6,580,124 B1 | 6/2003 | Cleeves et al. | |
| 6,744,094 B2 | 6/2004 | Forbes | |
| 6,754,105 B1 | 6/2004 | Chang et al. | |
| 6,759,282 B2 | 7/2004 | Campbell et al. | |
| 6,873,004 B1 | 3/2005 | Han et al. | |
| 6,946,703 B2 | 9/2005 | Ryu et al. | |
| 7,005,350 B2 | 2/2006 | Walker et al. | |
| 7,301,196 B2 | 11/2007 | Ding | |
| 7,512,012 B2 | 3/2009 | Kuo | |
| 7,612,411 B2 | 11/2009 | Walker | |
| 8,026,521 B1 | 9/2011 | Or-Bach et al. | |
| 8,569,827 B2* | 10/2013 | Lee | H01L 29/7926 257/324 |
| 8,630,114 B2 | 1/2014 | Lue | |
| 8,743,612 B2 | 6/2014 | Choi et al. | |
| 8,878,278 B2 | 11/2014 | Alsmeier et al. | |
| 9,190,293 B2 | 11/2015 | Wang et al. | |
| 9,379,126 B2 | 6/2016 | Chiu et al. | |
| 9,412,752 B1 | 8/2016 | Yeh et al. | |
| 9,748,172 B2 | 8/2017 | Takaki | |
| 9,842,651 B2 | 12/2017 | Harari | |
| 9,892,800 B2 | 2/2018 | Harari | |
| 9,911,497 B1 | 3/2018 | Harari | |
| 10,074,667 B1 | 9/2018 | Higashi | |
| 10,096,364 B2 | 10/2018 | Harari | |
| 10,121,553 B2 | 11/2018 | Harari | |
| 10,249,370 B2 | 4/2019 | Harari | |
| 10,381,378 B1 | 8/2019 | Harari | |
| 10,395,737 B2 | 8/2019 | Harari | |
| 10,431,596 B2 | 10/2019 | Herner et al. | |
| 10,475,812 B2 | 11/2019 | Harari | |
| 10,622,377 B2 | 4/2020 | Harari et al. | |
| 2001/0030340 A1 | 10/2001 | Fujiwara | |
| 2001/0053092 A1 | 12/2001 | Kosaka et al. | |
| 2002/0051378 A1 | 5/2002 | Ohsawa | |
| 2002/0193484 A1 | 12/2002 | Albee | |
| 2004/0246807 A1 | 12/2004 | Lee | |
| 2005/0128815 A1 | 6/2005 | Ishikawa et al. | |
| 2006/0155921 A1 | 7/2006 | Gorobets et al. | |
| 2008/0239812 A1 | 10/2008 | Naofumi et al. | |
| 2009/0157946 A1 | 6/2009 | Arya | |
| 2009/0237996 A1 | 9/2009 | Kirsch et al. | |
| 2009/0279360 A1 | 11/2009 | Peter et al. | |
| 2009/0316487 A1 | 12/2009 | Lee et al. | |
| 2010/0124116 A1 | 5/2010 | Takashi et al. | |
| 2010/0155810 A1* | 6/2010 | Kim | H01L 29/792 257/316 |
| 2011/0208905 A1 | 8/2011 | Shaeffer et al. | |
| 2011/0298013 A1 | 12/2011 | Hwang et al. | |
| 2012/0182801 A1 | 7/2012 | Lue | |
| 2012/0243314 A1 | 9/2012 | Takashi | |
| 2013/0020707 A1 | 1/2013 | Or-Bach et al. | |
| 2013/0256780 A1 | 10/2013 | Kai et al. | |
| 2014/0117366 A1 | 5/2014 | Saitoh | |
| 2014/0151774 A1 | 6/2014 | Rhie | |
| 2014/0328128 A1 | 11/2014 | Louie et al. | |
| 2014/0340952 A1 | 11/2014 | Ramaswamy et al. | |
| 2016/0086970 A1 | 3/2016 | Peng | |
| 2016/0314042 A1 | 10/2016 | Plants | |
| 2017/0092370 A1 | 3/2017 | Harari | |
| 2017/0092371 A1 | 3/2017 | Harari | |
| 2017/0125483 A1 | 5/2017 | Tanaka | |
| 2017/0148517 A1 | 5/2017 | Harari | |
| 2018/0108416 A1 | 4/2018 | Harari | |
| 2018/0269229 A1 | 9/2018 | Or-Bach et al. | |
| 2018/0366471 A1 | 12/2018 | Harari et al. | |
| 2018/0366489 A1 | 12/2018 | Harari et al. | |
| 2019/0006009 A1 | 1/2019 | Harari | |
| 2019/0006014 A1 | 1/2019 | Harari | |
| 2019/0164985 A1 | 5/2019 | Lee | |
| 2019/0180821 A1 | 6/2019 | Harari | |
| 2019/0206890 A1 | 7/2019 | Harari et al. | |
| 2019/0244971 A1 | 8/2019 | Harari | |
| 2019/0325964 A1 | 10/2019 | Harari | |
| 2019/0319044 A1 | 11/2019 | Harari | |
| 2019/0355747 A1 | 11/2019 | Herner et al. | |
| 2020/0051990 A1 | 2/2020 | Harari et al. | |
| 2020/0098779 A1 | 3/2020 | Cernea et al. | |
| 2020/0176468 A1 | 6/2020 | Herner et al. | |

OTHER PUBLICATIONS

"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2018/067338", dated May 8, 2019.
"PCT Search Report and Written Opinion, PCT/US2019/014319", dated Apr. 15, 2019.
Kim, N., et al., "Multi-layered Vertical gate NANO Flash Overcoming Stacking Limit for Terabit Density Storage", Symposium on VLSI Tech Dig. of Technical Papers, 2009, pp. 188-189.
Lue, H.T., et al., "A Highly Scalable 8-Layer 3D Vertical-gate {VG} TFT NANO Flash Using Junction-Free Buried Channel BE-SONOS Device", Symposium on VLSI: Tech. Dig. Of Technical Papers, 2010, pp. 131-132.
Tanaka, T., et al., "A 768 GB 3b/cell 3D-Floaling-Gate NANO Flash Memory", Digest of Technical Papers, the 2016 IEEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
"PCT Search Report and Written Opinion, PCT/US2020/041343", dated Sep. 30, 2020, 10 pages.

* cited by examiner

PROCESS FOR A 3-DIMENSIONAL ARRAY OF HORIZONTAL NOR-TYPE MEMORY STRINGS

CROSS REFERENCE TO RELATED APPLICATIONS

The present application is related to and claims priority of U.S. provisional patent application ("Provisional Application I"), Ser. No. 62/872,174, entitled "PROCESS FOR A 3-DIMENSIONAL ARRAY OF HORIZONTAL NOR-TYPE MEMORY STRINGS," filed on Jul. 9, 2019.

The present application is related to (i) U.S. patent application ("Non-provisional Application I"), Ser. No. 16/107,118, entitled "Capacitive-coupled Non-volatile Thin-film Transistor Strings in Three-Dimensional Arrays," filed Aug. 21, 2018 and published as U.S. Patent Application Publication 2019/0006014; (ii) U.S. patent application ("Non-provisional Application II"), Ser. No. 16/012,731, entitled "3-Dimensional NOR Memory Array Architecture and Methods for Fabrication Thereof," filed Jun. 19, 2018; and (iii) U.S. patent application ("Non-provisional Application III"), Ser. No. 16/230,981, entitled "3-Dimensional NOR Memory Array with Very Fine Pitch Device and Method," filed on Dec. 21, 2018.

The disclosures of Non-provisional Applications I-III (collectively, the "Non-provisional Applications") are hereby incorporated by reference in their entireties.

BACKGROUND OF THE INVENTION

1. Field of the Invention

The present invention relates to a fabrication process for memory circuits. In particular, the present invention relates to a fabrication process for a 3-dimensional array of NOR-type memory strings.

2. Discussion of the Related Art

The Non-provisional Applications disclose 3-dimensional arrays of horizontal NOR-type memory strings ("HNOR arrays") and methods for fabricating such HNOR arrays. In this description, a NOR-type memory string includes numerous storage transistors sharing a common source region and a common drain region. A storage transistor in this context is a variable-threshold transistor whose threshold voltage is determined by the amount of electrical charge trapped or stored in a charge storage region (e.g., an oxide-nitride-oxide triple-layer) provided between a channel region and a gate region. Reading, programming, inhibiting and erasing operations carried out on the storage transistor are accomplished by applying proper voltage biases to the source, drain, gate and channel regions of the storage transistor. In one example, an HNOR array is fabricated over a planar surface of a semiconductor substrate and includes a regular arrangement of horizontal NOR-type memory strings ("HNOR memory strings"). In this disclosure, the terms "horizontal" and "vertical" refer, respectively, to directions that are substantially parallel and substantially orthogonal to the planar surface. Each HNOR string includes storage transistors formed along one or both sides of a strip of semiconductor material ("active strip"), with each active strip including (i) two heavily-doped semiconductor layers providing, respectively, the common drain and the common source regions for the storage transistors, and (ii) a layer of lightly-doped semiconductor layer provided between the heavily-doped semiconductor layers. The lightly-doped semiconductor layer provides channel regions for the storage transistors. In the example, at least one of the heavily-doped semiconductor layers is in contact with a metallic conductive layer along its length to reduce the electrical resistance in the heavily-doped semiconductor layer. Multiple active strips may be stacked one on top of another ("active stack"), and multiple active stacks may be formed side-by-side and spaced from each other to form an HNOR array. A charge-trapping layer is provided on the sidewalls of each active stack. Between adjacent active stacks are provided vertical conductors, each serving as a local word line that connects the gate electrodes of storage transistors in multiple active strips of two adjacent active stacks. A storage transistor may be formed where the lightly-doped semiconductor layer of an active strip overlaps a vertical conductor, isolated from the vertical conductor by a charge-trapping material.

SUMMARY

The present invention provides highly efficient fabrication processes for HNOR arrays. In these processes, the channel regions of the storage transistors in the HNOR arrays are protected by a protective layer after deposition until the subsequent deposition of a charge-trapping material before forming local word lines. Both the silicon for the channel regions and the protective material may be deposited in amorphous form and are subsequently crystallized in an anneal step. The protective material may be silicon boron, silicon carbon or silicon germanium. The protective material induces greater grain boundaries in the crystallized silicon in the channel regions, thereby providing greater charge carrier mobility, greater conductivity and greater current densities.

According to one embodiment of the present invention, a process comprising: (a) forming, above a planar surface of a substrate, a structure comprising a plurality of groups of material layers, each group of material layers ("active layer") provided one above another along a first direction substantially orthogonal to the planar surface of the substrate, each active layer including (i) first and second layers of a first material, (ii) a layer of a second material provided between the first and second layers of the first material, and (iii) an isolation layer separating the active layer from an adjacent active layer; (b) etching a first set of trenches through the active layers, with each trench running along a second direction substantially parallel to the planar surface of the substrate, thereby forming a first plurality of material stacks ("active stacks") out of the structure; (c) in each active stack, forming recesses into the layers of the second material by removing a portion of each layer of the second material from sidewalls of the active stack; (d) depositing conformally a layer of a channel material over the sidewalls of the active stacks; (e) depositing a layer of a protective material over the layer of the channel material and filling the recesses; (f) etching back the layer of the protective material to expose the layer of the channel material on the sidewalls of the active stacks, while retaining, in each recess of each active stack, a portion of the layer of protective material to cover a corresponding portion of the layer of the channel material; (g) removing exposed portions of the layer of the channel material from the side walls of the active stacks; and (h) filling the first set of trenches by a fifth material.

In some embodiments, the isolation layer comprises silicon oxy-carbide (SiOC), the second material comprises a silicon oxide, which may also selected for the fifth material. The channel material may a lightly-doped p-type or n-type semiconductor material, while the first material may be a heavily-doped n-type or p-type semiconductor material (i.e., of opposite dopant type as the third material). The first material may be first provided as a sacrifice material and subsequently replaced by the semiconductor material, so as to reduce the number of deposition and in situ doping steps for the semiconductor materials.

The active stacks may be formed by multiple trench-forming steps, with each successive trench-forming dividing the active stacks into narrow active stacks. Oxide pillars may be provided to lend mechanical support for the active stacks during the trench-forming steps. The oxide pillars may be anchored in the substrate.

According to one embodiment of the present invention, after each trench-forming step, the steps (c) to (g) above are repeated to provide the channel material and the protective covering. Thereafter, the process (a) forms a plurality of shafts in the trenches, exposing in each shaft the portions of the protective material; and (b) removes the portions of the protective material to expose the corresponding portions of the channel material. A charge trapping layer on the sidewalls of the shafts may then be deposited and the shafts filled with a conductive material. In some embodiment, the shafts may also be formed in multiple successive etch step. At each such etch step, the shafts that are formed in previous etch step is filled with a sacrificial material. In this manner, even though the etch steps are high aspect ratio etch steps, the sacrificial material lends mechanical support. The sacrificial material may be, for example, silicon oxy-carbide (SiOC).

Using the process steps of the present invention, the each active layer of each active stack in the HNOR array thus formed includes a common source region, a common drain region and a channel region for the storage transistors. The conductors in the shafts provide the local word lines. The local word lines may be connected to decoding circuitry by global word lines that may be provided above or below the HNOR array.

The present invention is better understood upon consideration of the detailed description below in conjunction with the accompanying drawings.

DETAILED DESCRIPTION OF THE PREFERRED EMBODIMENTS

Figure 1:
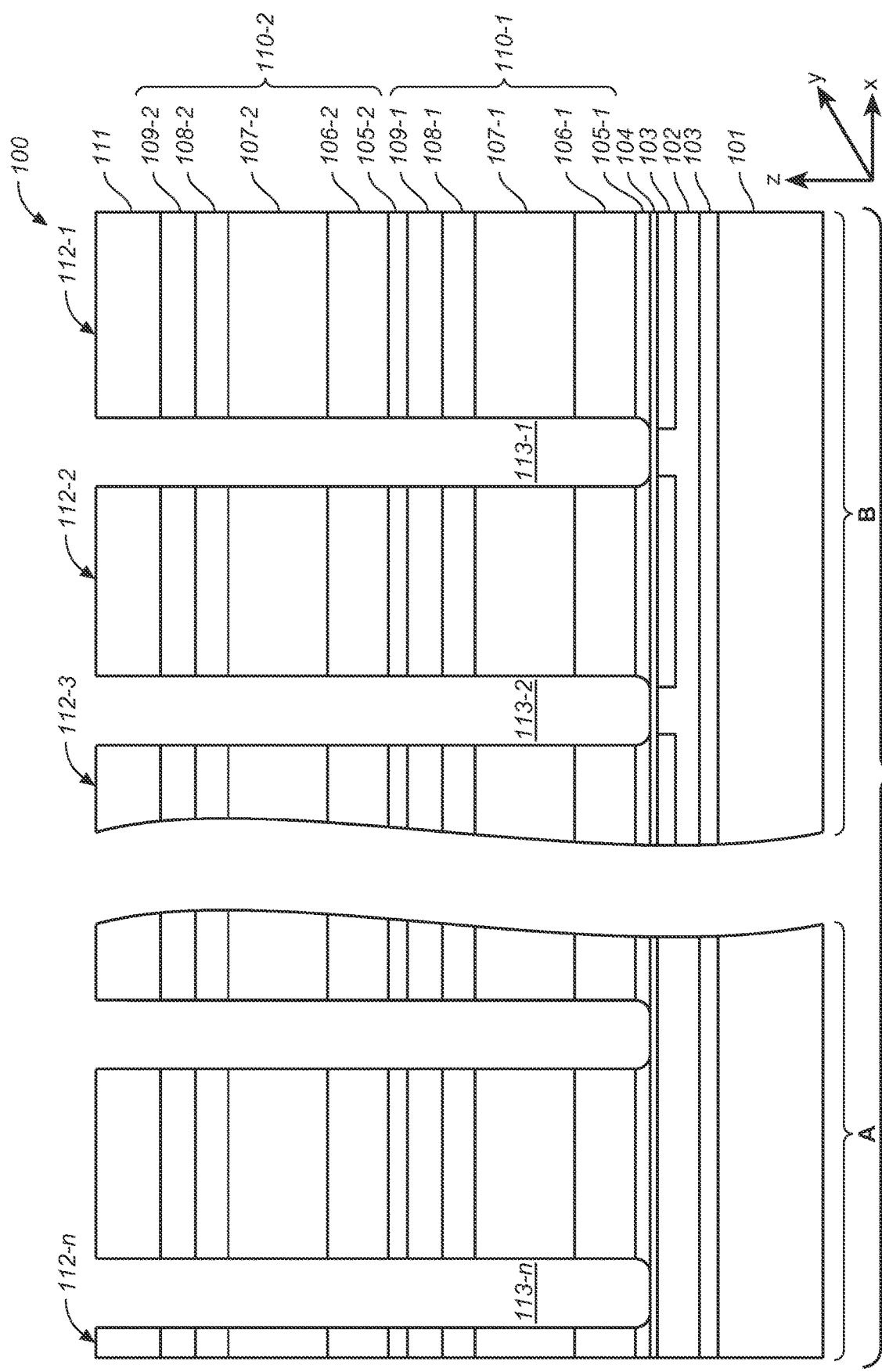
FIG. 1 shows cross sections A and B of semiconductor structure 100, at one intermediate step of a fabrication process for an HNOR array, according to one embodiment of the present invention.

The present invention provides highly efficient fabrication processes for HNOR arrays. FIG. 1 shows cross sections A and B of semiconductor structure 100, at one intermediate step of a fabrication process for an HNOR array, according to one embodiment of the present invention. Initially, a network of interconnection conductors ("bottom word lines") 102, such as tungsten conductors, are formed above a planar surface of substrate 101. Substrate 101 may be, for example, a semiconductor wafer (e.g., a silicon wafer). Bottom word lines 102—including conductor-filled via for their electrical connection—may be formed using, for example, a damascene process. In the damascene process, bottom word lines 102 are defined and deposited in insulator layer 103 (e.g., silicon oxide), and chemical-mechanical polished (CMP). Bottom word lines 102 are provided as parallel conductors running along the same direction. To facilitate this detailed description, the vertical direction in the figures is indicated by the Z-direction and the cross sections A and B in the figures are seen as taken in the X-Z plane, with the Y-direction being the direction orthogonal to both the X- and Z-directions.

As shown in FIG. 1, cross sections A and B are, respectively, vertical sections through oxide layer 103 between adjacent conductors of bottom word lines 102 and through a conductor of bottom word line 102, respectively. Thereafter, etch-stop layer 104 (e.g., a 50-100 Å thick layer of aluminum oxide) is provided to protect bottom word lines 102 and to carry out subsequent etching steps with greater precision. Several groups of material layers—each group being referred herein as an "active layer"—are then successively formed over etch-stop layer 104. As described below, the material layers in each active layer may be a functional layer or a precursor (or "sacrificial" layer) to a functional layer in an active strip. In FIG. 1, even though only two active layers (i.e., active layers 110-1 and 110-2) are shown, solely for the purpose of illustration, any suitable number of active layers may be provided (e.g., 8, 16, 32 or more). Active layer 110-1 includes (i) deposited oxide layer 105-1 (e.g., 500-1500 Å thick layer of silicon oxy-carbide or "SiOC"); (ii) first sacrificial layer 106-1 (first "SAC1" layer; e.g., a 350-1100 Å thick layer of silicon nitride), (iii) high temperature oxide (HTO) layer 107-1 (e.g., 500-1500 Å), (iv) second SAC1 layer 108-1 (e.g., 150-500 Å thick), and (v) second sacrificial layer 109-1 ("SAC2" layer; e.g., 250-700 Å thick layer of silicon boron (SiB), silicon carbon (SiC) or silicon-germanium (SiGe)). The other active layers (e.g., active layer 110-2) each have substantially the same material layers. In this description, a suffixed reference numeral indicates a reference to a specific instance ("specific reference"). For example, the suffixed reference "105-1" refers is a reference to a specific instance of a set of like features that are each referenced generally by reference numeral "105." A statement that is made in the context of a general reference (i.e., a non-specific reference) is applicable to all specific references.

Hard mask 111 is then provided on the active layers. An anisotropic etch of the active layers 110 down to etch-stop layer 104 is then carried out, to form first set of active stacks 112 (e.g., active stacks 112-1, 112-2, . . . and 112-n) and trenches 113 (e.g., trenches 113-1, 113, . . . and 113-n). Active stacks 112 and trenches 113 may be, for example, 190 nm and 70 nm wide (X-direction), respectively.

In this embodiment, as discussed below, first and second SAC1 layers 106-1 and 108-1 are to be replaced at a subsequent step by in situ-doped N$^+$ polysilicon to provide source and drain regions, respectively, for the storage transistors. Silicon nitride may be used for the SAC1 layers, because of the etch-selectivity of silicon nitride available relative to HTO layer 107. SAC2 layer 109-1 is to be subsequently replaced by a metal layer to provide a low resistivity in the drain region. Any of silicon boron, silicon carbon and silicon germanium may be selected for SAC2 layer 109-1, on account of their etch-selectivity (e.g., in hot phosphoric acid) relative to N$^+$-doped polysilicon.

Figure 2:
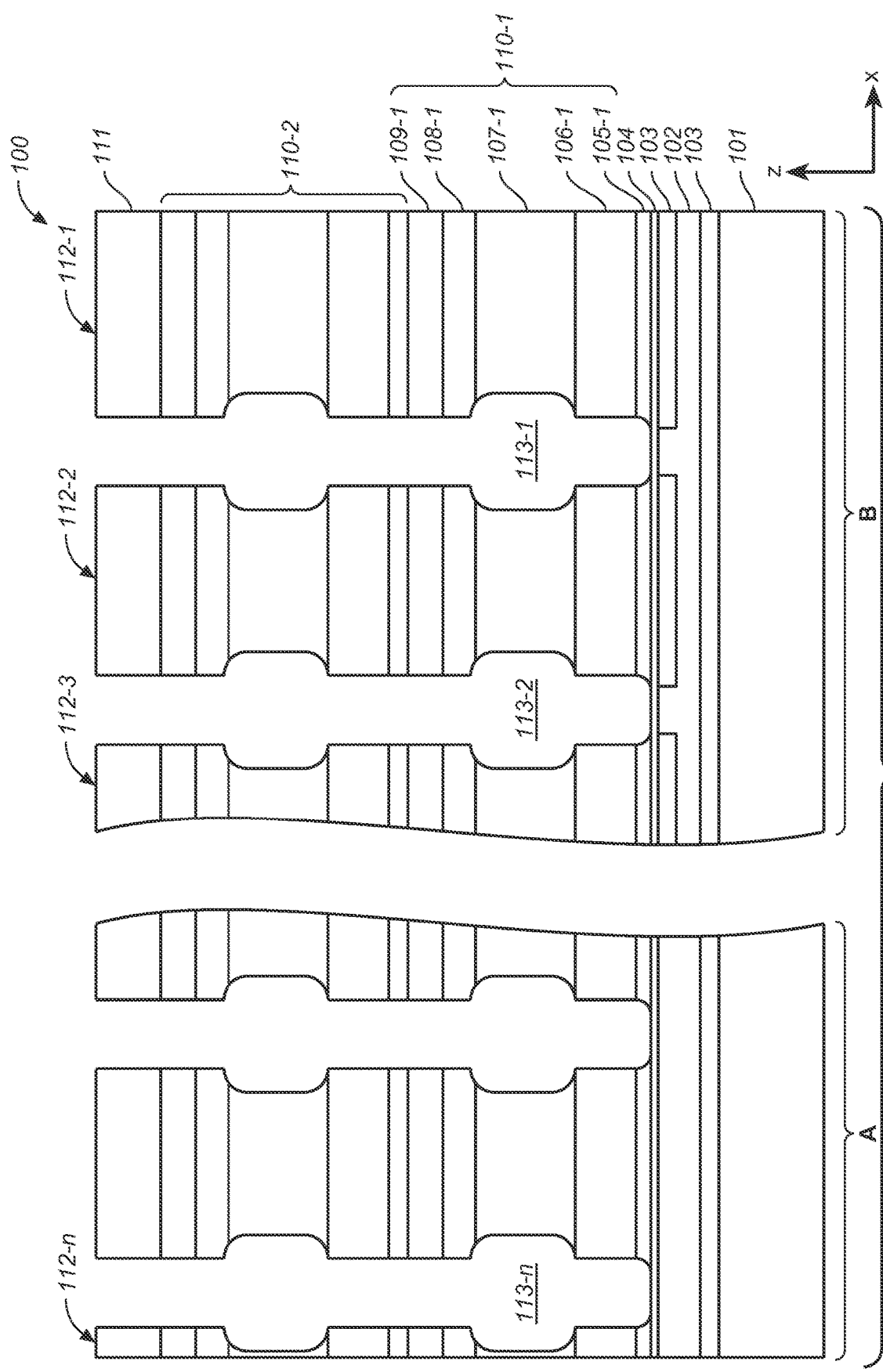
FIG. 2 shows resulting cross sections A and B of semiconductor structure 100 of FIG. 1, after a recess step creates a recess in HTO layer 107, in accordance with one embodiment of the present invention.

Thereafter, an isotropic oxide etch step recesses HTO oxide 107 (e.g., by 75-250 Å) in each active layer. The resulting cross sections of semiconductor structure 100 is shown in FIG. 2. Amorphous silicon layer 301 (e.g., 40-120 Å thick) is then deposited conformally over the sidewalls of active stacks. 112, including the recessed surface of HTO layers 107. Following the conformal deposition of amorphous silicon layer 301, amorphous silicon germanium (SiGe) layer 302 (e.g., 100-300 Å thick) is deposited over amorphous silicon layer 301. An anneal step may then be carried out to crystallize both amorphous silicon layer 301 and amorphous SiGe layer 302 into crystallized layers. Amorphous silicon layer 301 becomes a polysilicon layer.

Figure 3:
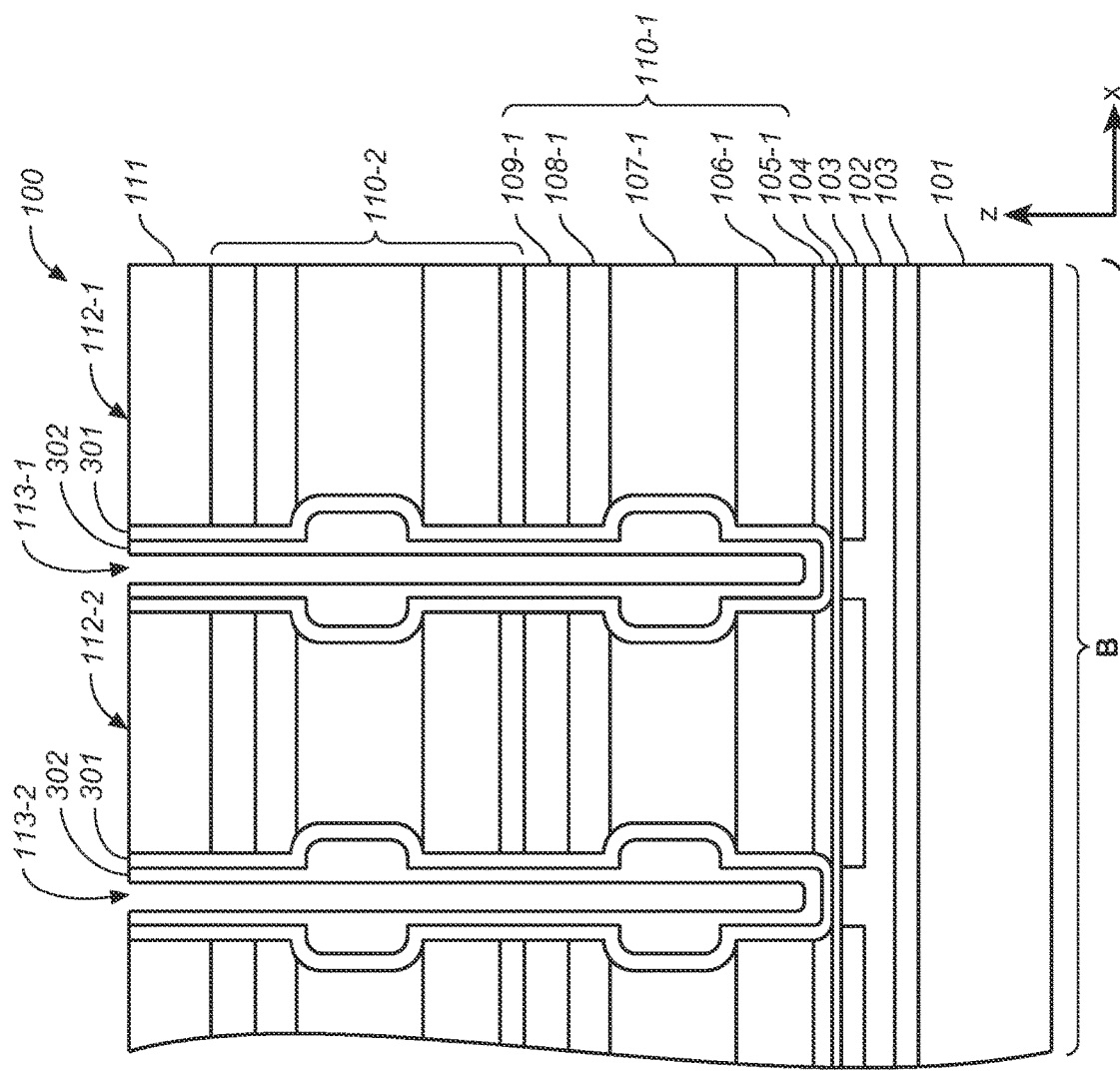
FIG. 3 shows resulting cross sections A and B of semiconductor structure 100 of FIG. 2, after depositions of amorphous silicon layer 301 and SiGe layer 302, in accordance with one embodiment of the present invention.

SiGe layer 302 provides numerous benefits. As SiGe typically has larger grain boundaries than polysilicon, crystallization of amorphous silicon in the presence of SiGe results in a material that also has larger grain boundaries than typical polysilicon and, hence, a greater carrier mobility. The greater carrier mobility provides both a greater electrical conductivity and an ability to sustain a higher electrical current density. SiGe layer 302 also protects polysilicon layer 301 from various subsequent etch steps (e.g., anisotropic dry etch steps) and prevents polysilicon stringers from being formed out of polysilicon silicon layer 301. FIG. 3 shows resulting cross sections A and B of semiconductor structure 100 of FIG. 2, after depositions of amorphous silicon layer 301 and SiGe layer 302, in accordance with one embodiment of the present invention.

Figure 4:
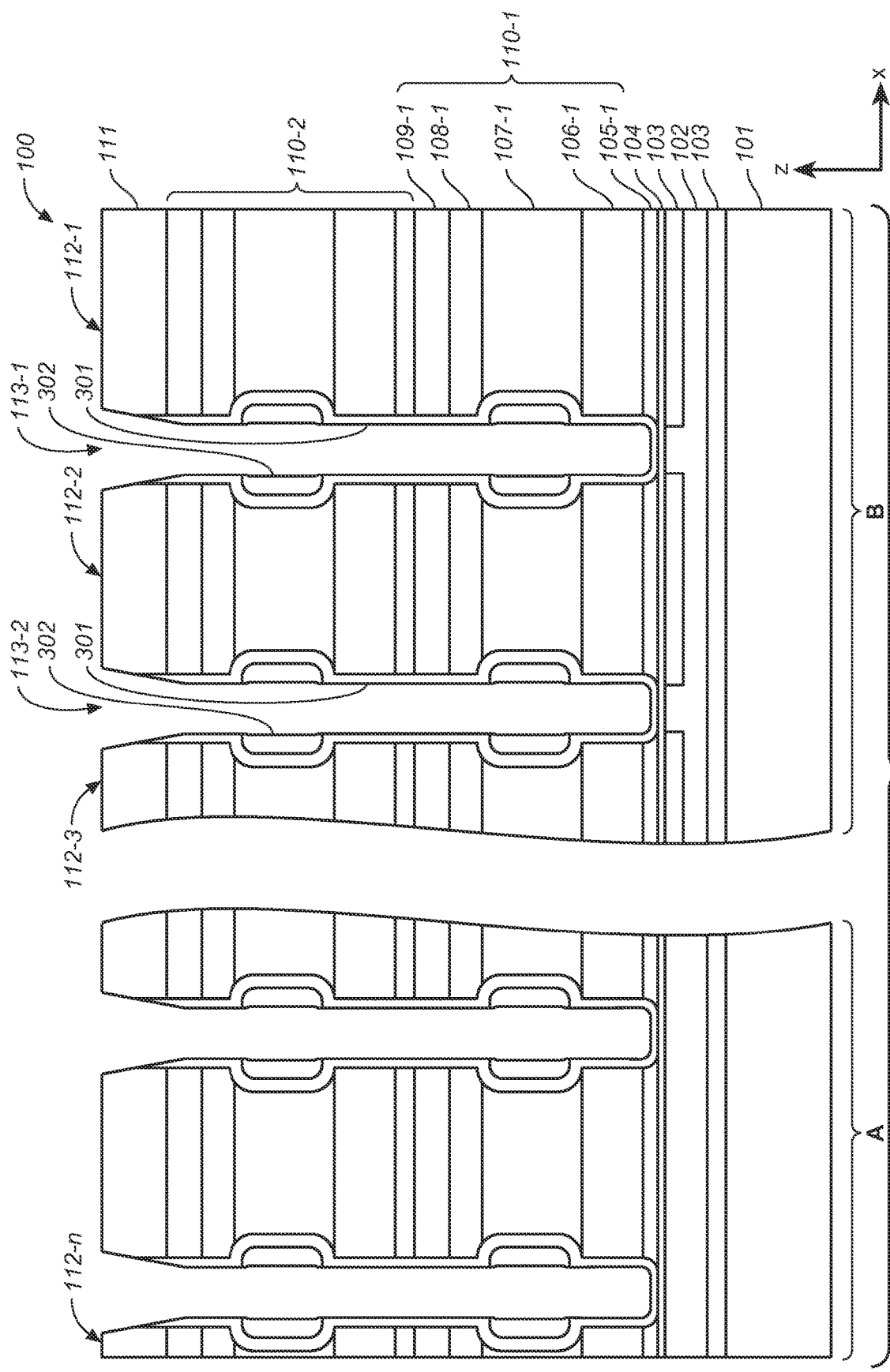
FIG. 4 shows resulting cross sections A and B of semiconductor structure 100 of FIG. 3, after anisotropic and isotropic etch steps of SiGe layer 302, in accordance with one embodiment of the present invention.

An anisotropic etch step, followed by an isotropic etch, are then carried out to remove SiGe layer 302 from the sidewalls of active stacks 112. During these etches, inside the recessed portions of HTO layer 107, SiGe layer 302 shields polysilicon layer 301 underneath. The isotropic etch step may be tuned with high selectivity (e.g., 100:1) to polysilicon to avoid damaging the exposed portions of polysilicon layer 301. FIG. 4 shows resulting cross sections A and B of semiconductor structure 100 of FIG. 3, after anisotropic and isotropic etch steps of SiGe layer 302, in accordance with one embodiment of the present invention.

Figure 5:
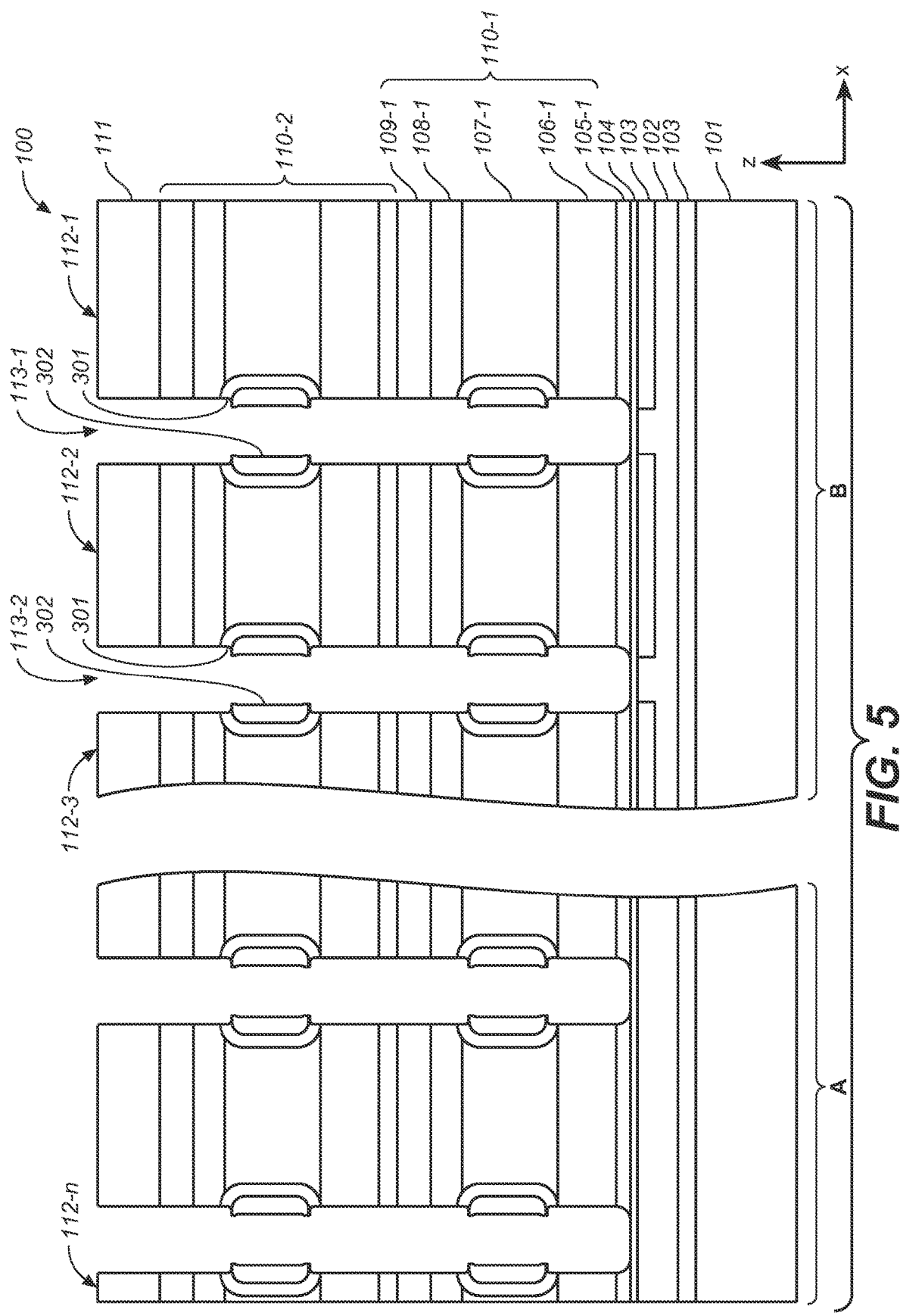
FIG. 5 shows resulting cross sections A and B of semiconductor structure 100 of FIG. 4, after an isotropic etch step of polysilicon layer 301, in accordance with one embodiment of the present invention.

Thereafter, an isotropic etch step (e.g., a radical etch step using hydrogen, chlorine, ammonia, or any combination of these species, in either atomic or molecular form) removes polysilicon layer 301 from the sidewalls of active stacks 112. This isotropic etch step may be tuned with high selectivity (e.g., 100:1) to SiGe to avoid removal of the remaining SiGe layer 302 from the recessed portions of HTO layer 107. FIG. 5 shows resulting cross sections A and B of semiconductor structure 100 of FIG. 4, after the isotropic etch step of polysilicon layer 301, in accordance with one embodiment of the present invention. These portions of polysilicon layer 301 ("channel polysilicon layer 301") that are overlaid and protected by SiGe layer 302 are intended for serving subsequently as channel regions of storage transistors in the HNOR array.

Figure 6A:
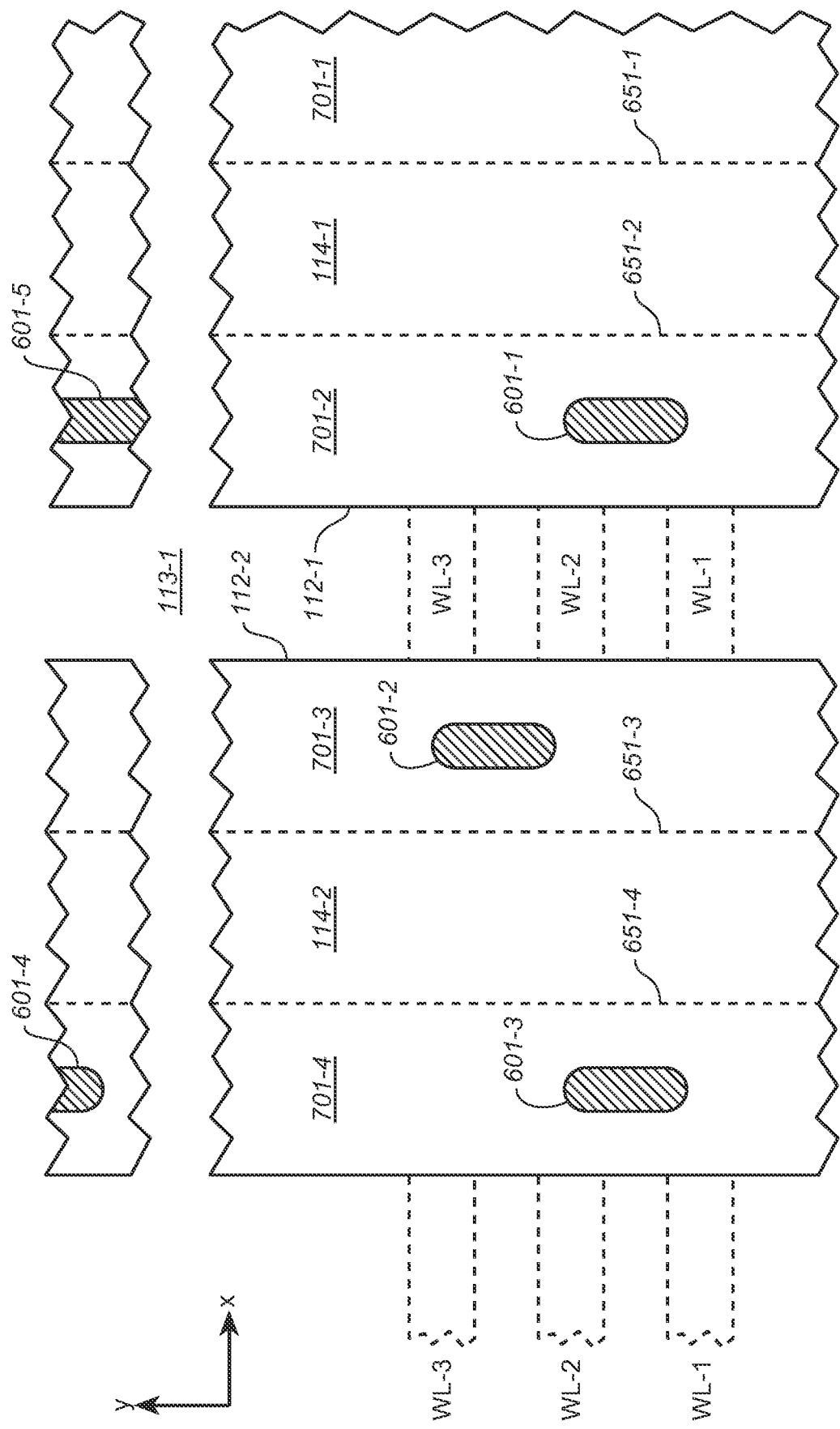
FIG. 6a is a top view (i.e., an X-Y plane view), showing locations of exemplary pillars 601-1 to 601-5 on exemplary active stacks 112-1 to 112-3 in semiconductor structure 100 of FIG. 5, in accordance with one embodiment of the present invention.

In some embodiments, where the number of active layers in an active stack is large, it may be desirable to design the etch steps creating active stacks 112 to have less than a predetermined aspect ratio. In one method, the active stacks in an HNOR array are created by multiple etch steps. Oxide pillars are also provided to lend mechanical support to the active stacks. FIG. 6a is a top view (i.e., a view over an X-Y plane), showing locations of exemplary oxide pillars 601-1 to 601-5 on exemplary active stacks 112-1 and 112-2, in accordance with one embodiment of the present invention. In FIG. 6a, exemplary active stacks 112-1 and 112-2 each extend lengthwise along the Y-direction, spaced apart along the X-direction by exemplary trench 113-1. Underneath active stacks 112-1 and 112-2 and running along the X-direction are bottom word lines 102 (e.g., exemplary bottom word lines WL-1 to WL-3).

FIG. 6a shows in dashed lines exemplary bottom word lines WL-1, WL-2 and WL-3. Active stacks 112-1 and 112-2 may each be, for example, 70 nm wide along the X-direction. Bottom word lines WL-1 to WL-3 may be 40 nm apart and may each have a width, for example, of 40 nm along the Y-direction. Exemplary oxide pillars 601-1, 601-2 and 601-3 are provided in a staggered formation in adjacent active stacks 112-1 and 112-2. Each oxide pillar may be oval and may have X- and Y-dimensions of 40 nm and 80 nm, respectively. As shown in FIG. 6a, oxide pillars 601-1 and 601-3 each overlap half the width of each of adjacent bottom word lines WL-1 and WL-2, and pillar 601-2 overlaps half the width of each of adjacent bottom word lines WL-2 and WL-3. Not having sharp corners allow the oxide pillars to be formed using relatively less demanding etch steps. The mechanical support required during the etch steps of active stack formation may be satisfied by having oxide pillars 601-3 and 601-4—which are both provided on active stack 113-2—placed even microns apart along the Y-direction.

Figure 7:
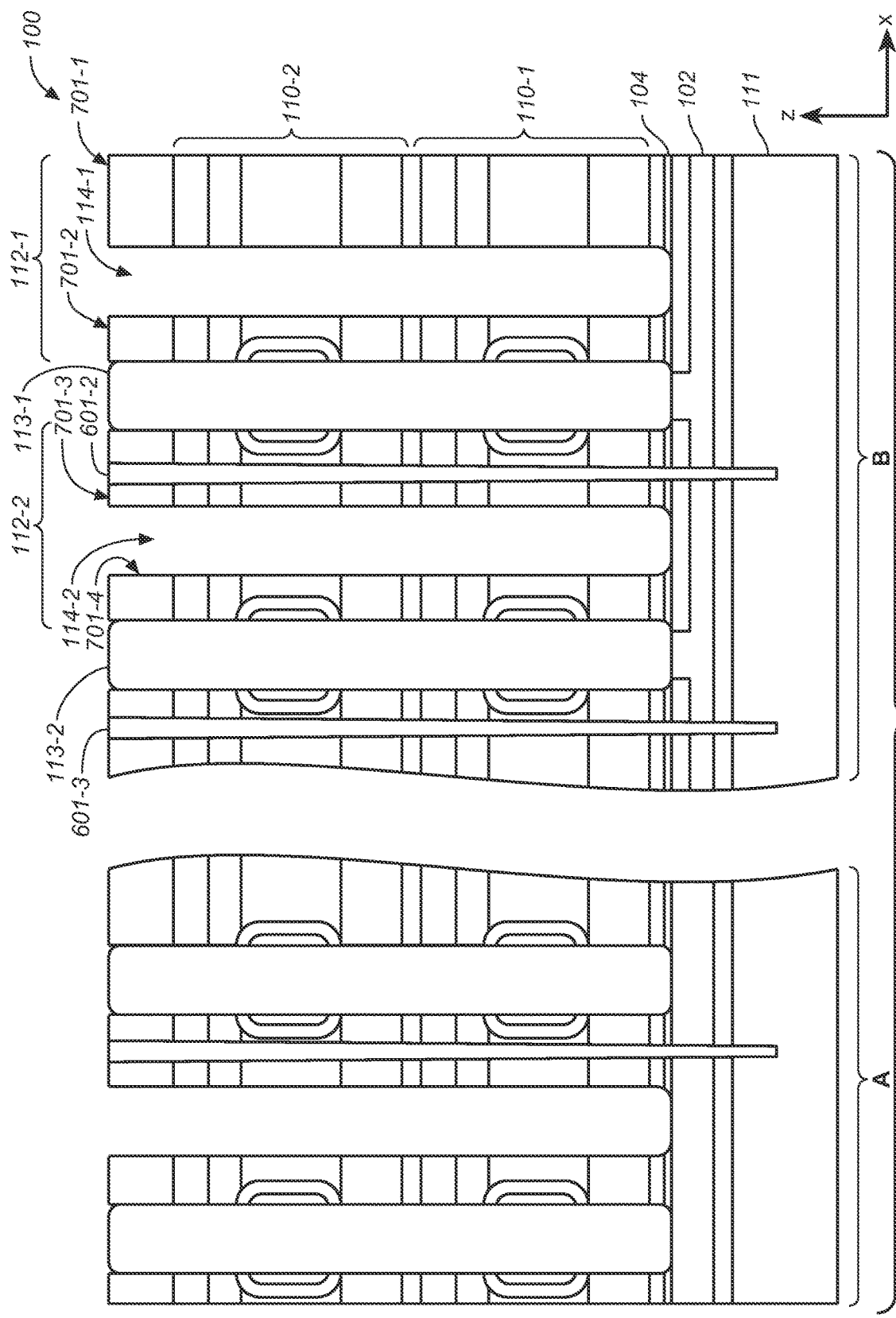
FIG. 7 shows resulting cross sections A and B of semiconductor structure 100 of FIG. 6b, after creating trenches 114-1 and 114-2 in active stacks 112-2 and 112-3 by etching the active layers down to etch stop layer 104, in accordance with one embodiment of the present invention.

Oxide pillars 601 are positioned in each active stack such that, when an additional etch step—described below in conjunction with FIG. 7—creates additional trenches 114, active stacks 112 are each further divided into smaller active stacks 701. For example, as illustrated in FIG. 6a, active trenches 114-1 and 114-2 are to be formed between dashed lines 651-1 and 651-2 and between dashed lines 651-3 and 651-4, respectively, resulting in active stacks 112-1 and 12-2 being further divided into active stacks 701-1 to 701-4.

Figure 6B:
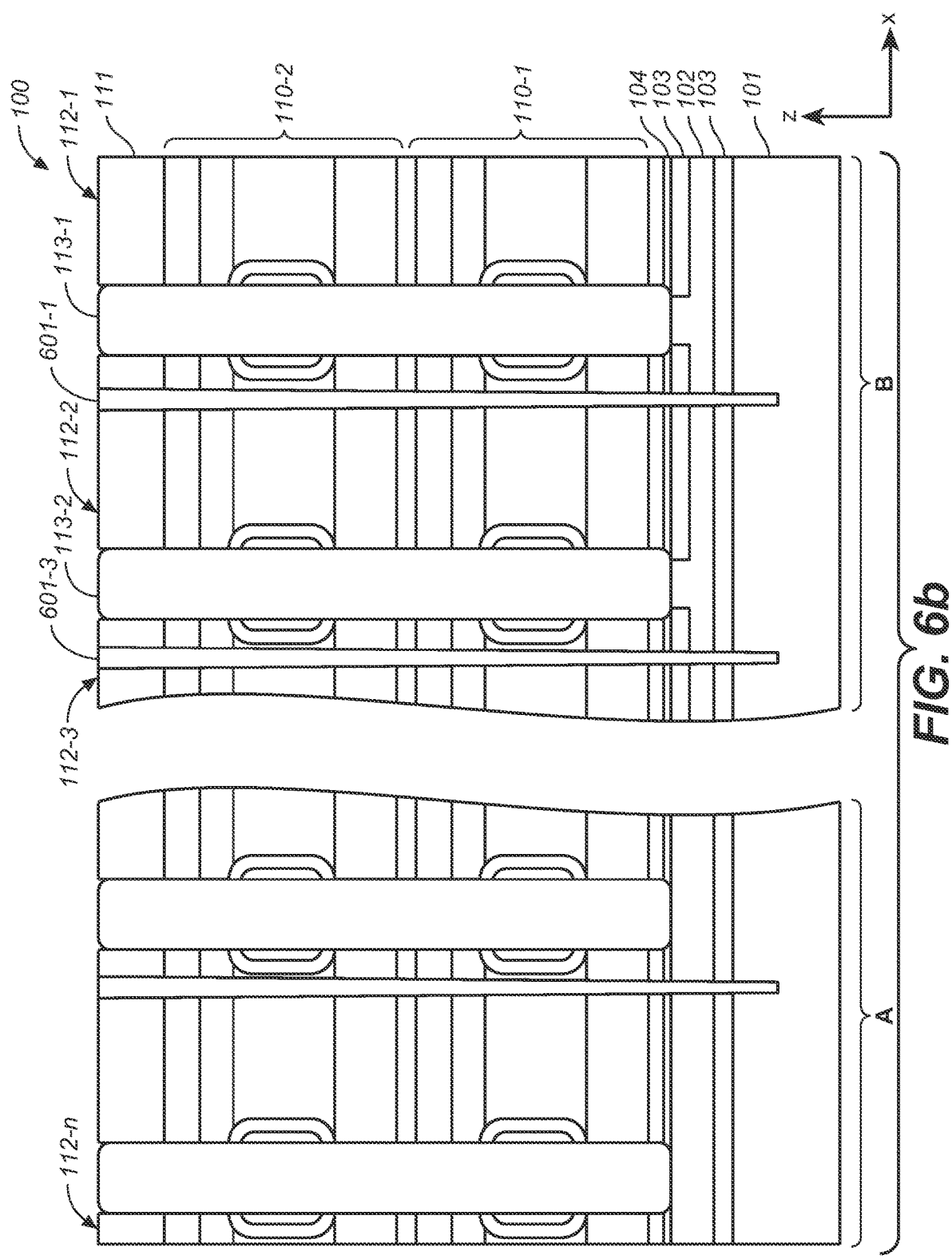
FIG. 6b shows resulting cross sections A and B of semiconductor structure 100 of FIG. 5, after filling pillars 601 and trenches 112 with silicon oxide and planarization by CMP, in accordance with one embodiment of the present invention.

Following the isotropic polysilicon etch step of FIG. 5, the shafts for oxide pillars 601 are etched. To provide the requisite mechanical support, the pillar shafts extend through the active layers, etch stop layer 104, isolation layer 103 and bottom word line layer 102 into substrate 101. Trenches 113-1 and 113-2 and the pillar shafts are then filled with a silicon oxide. FIG. 6b shows resulting cross sections A and B of semiconductor structure 100 of FIG. 5, after filling pillar shafts of oxide pillars 601 and trenches 113 with silicon oxide and planarization by CMP, in accordance with one embodiment of the present invention.

With the mechanical support by oxide pillars 601 and oxide-filled trenches 113, additional trenches 114 are created in active stacks 112 by an etch step that remove the active layers down to etch stop layer 104. FIG. 7 shows resulting cross sections A and B of semiconductor structure 100 of FIG. 6, after creating trenches 114-1 and 114-2 in active stacks 112-2 and 112-3 by etching the active layers down to etch stop layer 104, in accordance with one embodiment of the present invention. As shown in FIG. 7, trenches 114-1 and 114-2 are created by etching active stacks 112-1 and 112-2. This etch step divides active stacks 112 into active stacks 701. For example, as shown in FIG. 7, active stacks 112-1 and 112-2 are divided by this etch step into active stacks 701-1, 701-2, 701-3 and 701-4, respectively. Active stacks 701 and trenches 114 may be 70 nm and 60 nm wide, respectively, along the X-direction.

Figure 8:
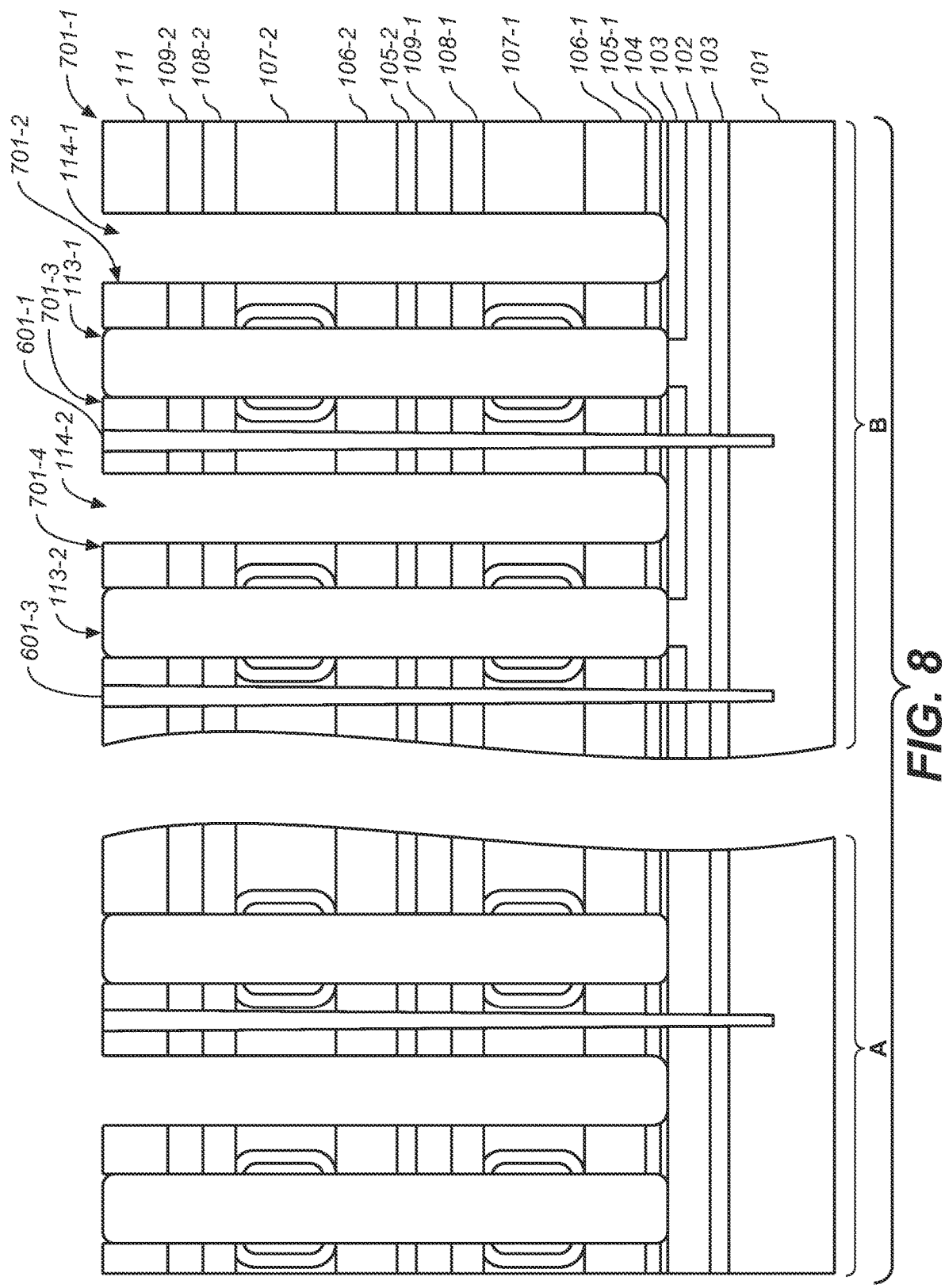
FIG. 8 shows resulting cross sections A and B of semiconductor structure 100 of FIG. 7, after replacement of SAC1 material in layers 106 and 108 by $N^+$-doped polysilicon, in accordance with one embodiment of the present invention.

Trenches 114 expose the sidewalls of active stacks 701. SAC1 layers 106 and 108 of each of active layers 110 are then replaced by $N^+$ polysilicon layers 106 and 108 using an isotropic etch step (e.g., hot phosphoric acid) of the SAC1 material, followed by an in situ $N^+$-doped polysilicon deposition (e.g., dopant concentration ~0.5-1.5×10$^{21}$ cm$^{-3}$). An anisotropic etch then removes excess $N^+$-doped polysilicon from trenches 114, thereby preventing any shorting between N+-doped polysilicon layers 106 and 108. Thereafter, a wet clean step (e.g., SC-1 cleaning, aqueous hydrofluoric acid and deionized water) may be performed. FIG. 8 shows resulting cross sections A and B of semiconductor structure 100 of FIG. 7, after replacement of the SAC1 material in SAC1 layers 106 and 108 by $N^+$-doped polysilicon, in accordance with one embodiment of the present invention.

Then, SAC2 layers 109 are replaced by metallic conductor layers. As SAC2 layers 109 may be SiB, SiC, SiGe or any of their combinations, SAC2 layers 109 may be removed using a suitable highly selective radical etch that is selective to oxide, nitride, and silicon. Such a radical etch may be accomplished using, for example, gaseous $Cl_2$, $F_2$ or both. A metal-fill step using a suitable metal (e.g., tungsten (W)) may then be carried out, following deposition of a liner material (e.g., titanium nitride (TiN)). An anisotropic etch step then removes the excess fill-metal and the liner from trench 114. Thereafter, the steps of FIGS. 2-5 (i.e., recessing the HTO layer, depositions of amorphous silicon and SiGe layers, annealing, anisotropic and isotropic etch steps of the SiGe layer, and the isotropic etch step of the polysilicon layer that results from annealing the amorphous silicon), as illustrated by the description above, are then carried out along the sidewalls of active stacks 701 to prepare additional channel regions in the exposed sidewalls of active stacks 701. Thereafter, trenches 114 are filled with a silicon oxide and are planarized by a CMP step.

Figure 9A:
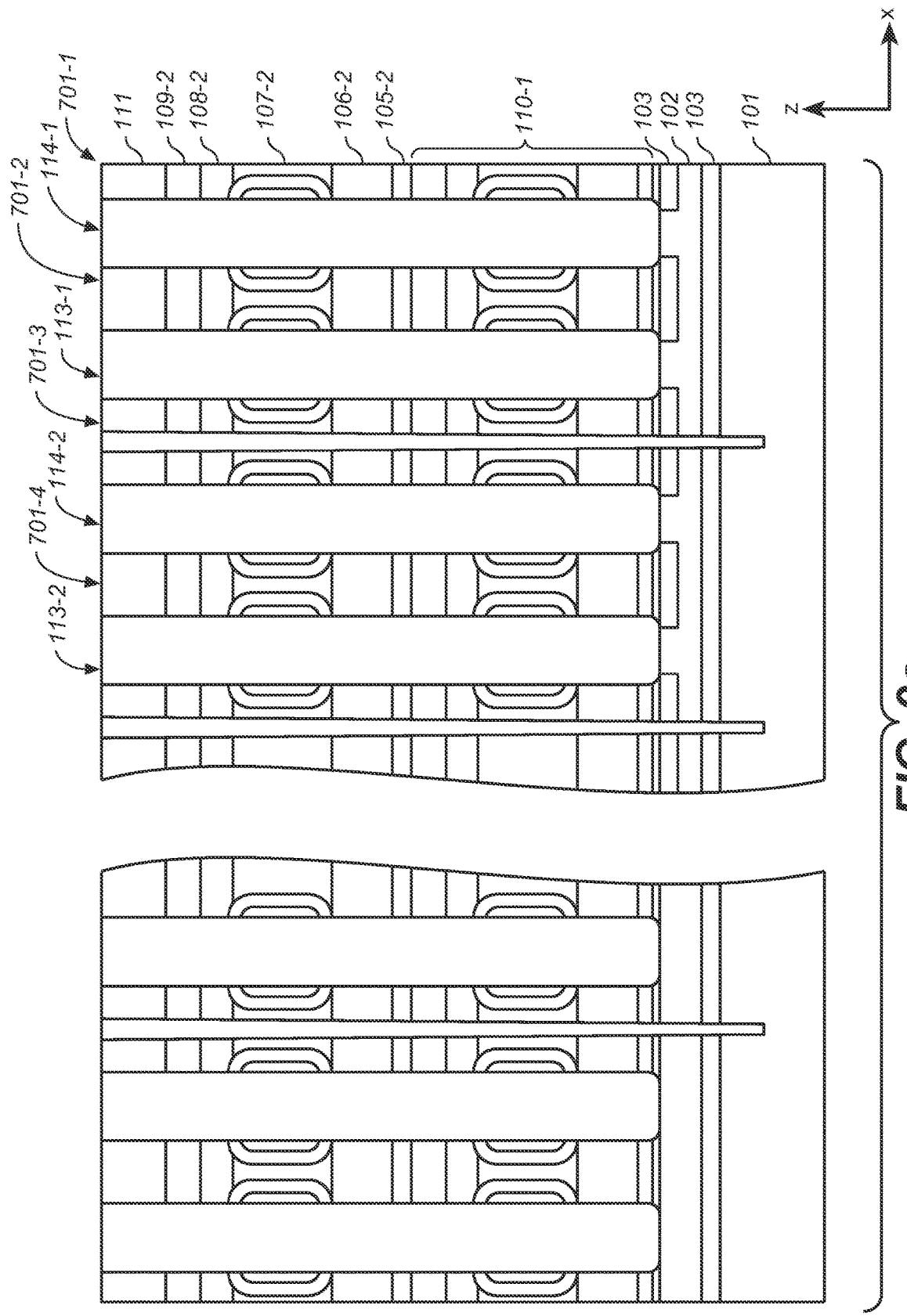
FIG. 9a shows resulting cross sections A and B of semiconductor structure 100 of FIG. 8, after replacing SAC2 layers 109 with metallic conductor layer 109 ("drain metal") and providing, in recessed portions of oxide layers 107 of active stacks 701, a second set of polysilicon layers 301 and SiGe layers 302, in accordance with one embodiment of the present invention.

FIG. 9a shows resulting cross sections A and B of semiconductor structure 100 of FIG. 8, after replacing SAC2 layers 109 with metallic conductor layer 109 ("drain metal") and providing, in recessed portions of oxide layers 107 of active stacks 701, a second set of channel polysilicon layers 301 and SiGe layers 302, in accordance with one embodiment of the present invention.

Figure 9B:
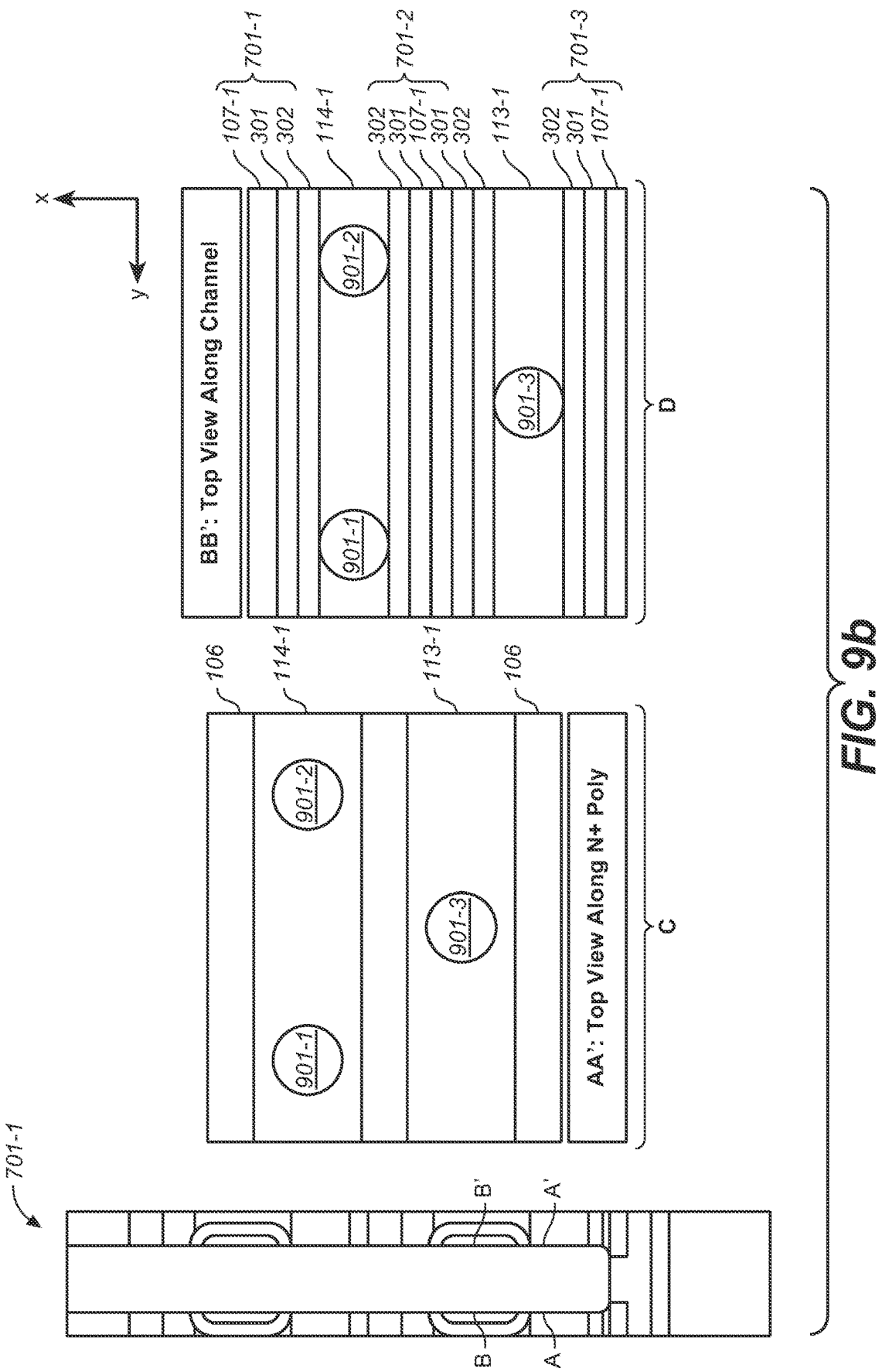
FIG. 9b shows X-Y plane cross sections C and D of a portion of semiconductor structure 100 of FIG. 9a, along line A-A' through $N^+$-doped polysilicon layer 106 or 108, and along line B-B' through HTO 107, respectively, after first set of memory holes 901-1 to 901-3 are cut, in accordance with one embodiment of the present invention.

First set of local word line shafts ("memory holes") 901 are then excavated by an oxide etch step in oxide-filled trenches 112 and 114. The etch step excavates the silicon oxide in oxide-filled trenches 112 and 114 down to etch stop layer 104. FIG. 9b shows X-Y plane cross sections C and D of semiconductor structure 100 of FIG. 9a, along line A-A' through $N^+$-doped polysilicon layer 106 or 108, and along line B-B' through HTO 107, respectively, after first set of memory holes 901-1 to 901-3 are cut, in accordance with one embodiment of the present invention. As shown in FIG. 9b, first set of memory holes 901 are arranged in a staggered formation.

Figure 10:
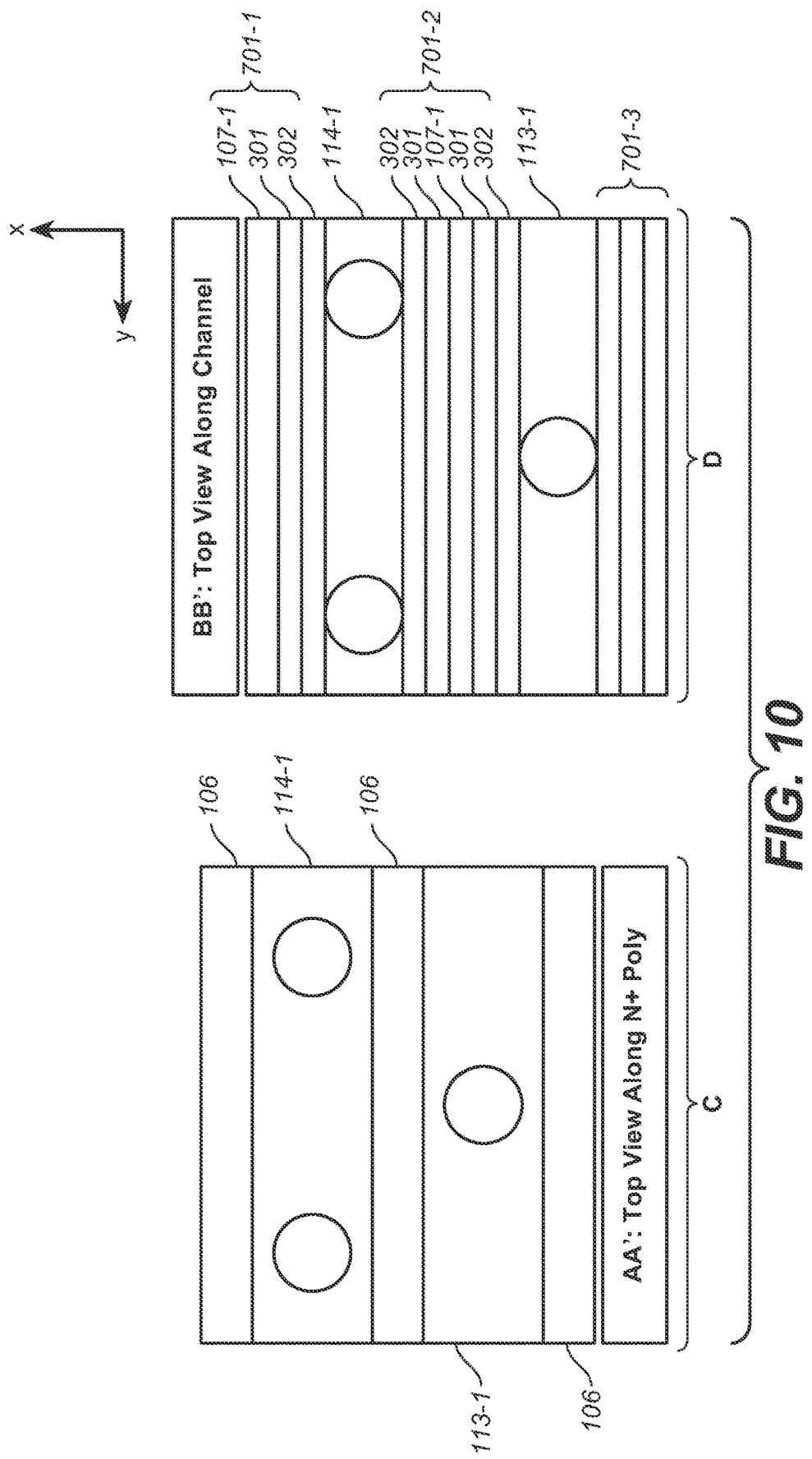
FIG. 10 shows cross sections C and D of semiconductor structure 100 of FIG. 9b, after memory holes 901- to 901-3 are filled with SiOC, in accordance with one embodiment of the present invention.
Figure 11:
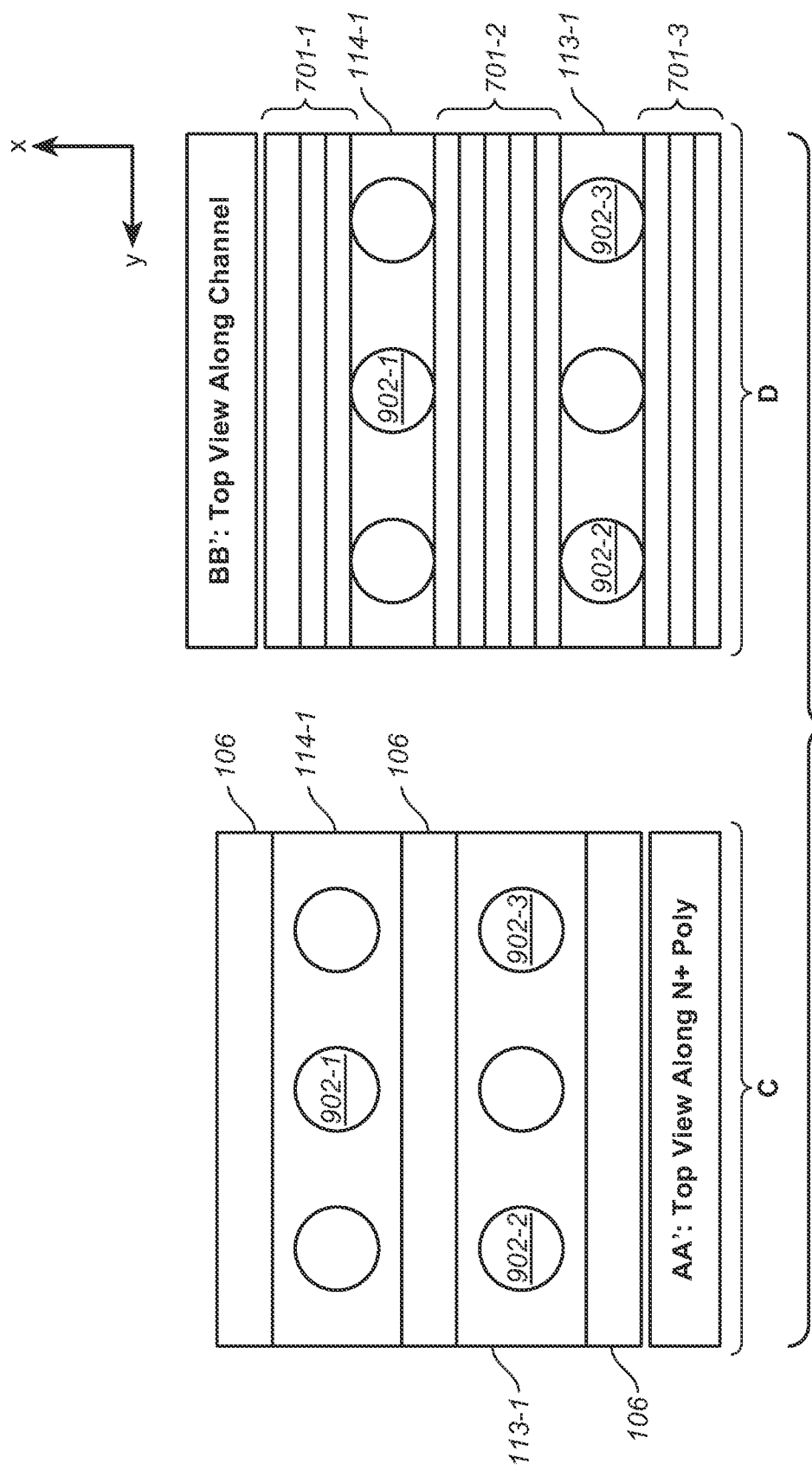
FIG. 11 shows cross sections C and D of semiconductor structure 100 of FIG. 10, after second set of memory holes 902-1 to 902-3 are cut, in accordance with one embodiment of the present invention.

First set of memory holes 901 are then filled with SiOC, as a sacrificial material. FIG. 10 shows cross sections C and D of semiconductor structure 100 of FIG. 9b, after memory holes 901- to 901-3 are filled with SiOC, in accordance with one embodiment of the present invention. Thereafter, second set of memory holes 902 are excavated by an oxide etch step in oxide-filled trenches 112 and 114; memory holes 902 are also arranged in a staggered formation. The etch step excavates the silicon oxide in oxide-filled trenches 112 and 114 down to etch stop layer 104. FIG. 11 shows cross sections C and D of semiconductor structure 100 of FIG. 10, after second set of memory holes 902-1 to 902-3 are excavated, in accordance with one embodiment of the present invention.

Figure 12:
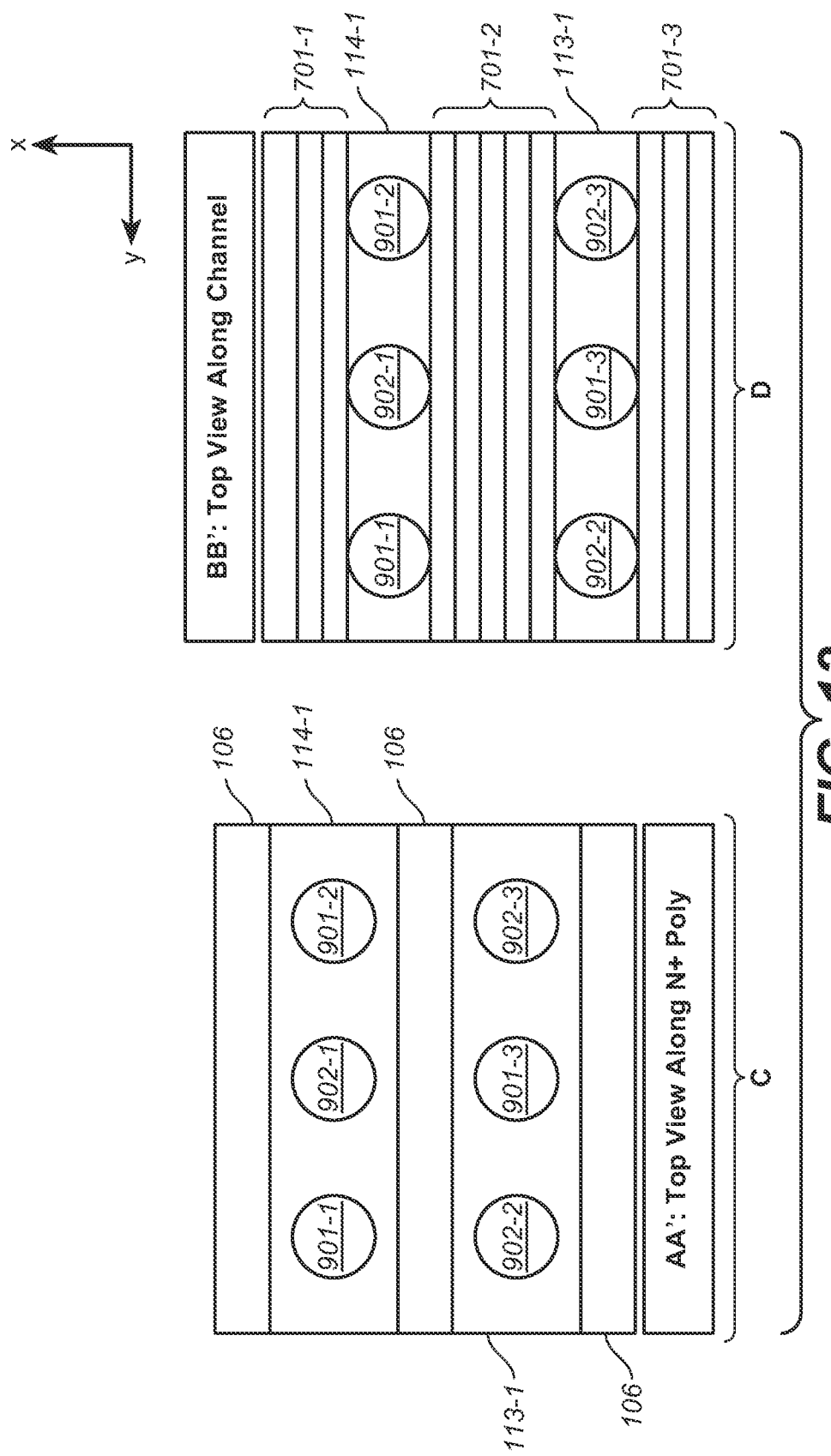
FIG. 12 shows cross sections C and D of semiconductor structure 100 of FIG. 11, after removal of the SiOC material from first set of memory holes 901-1 to 901-3, in accordance with one embodiment of the present invention.
Figure 13:
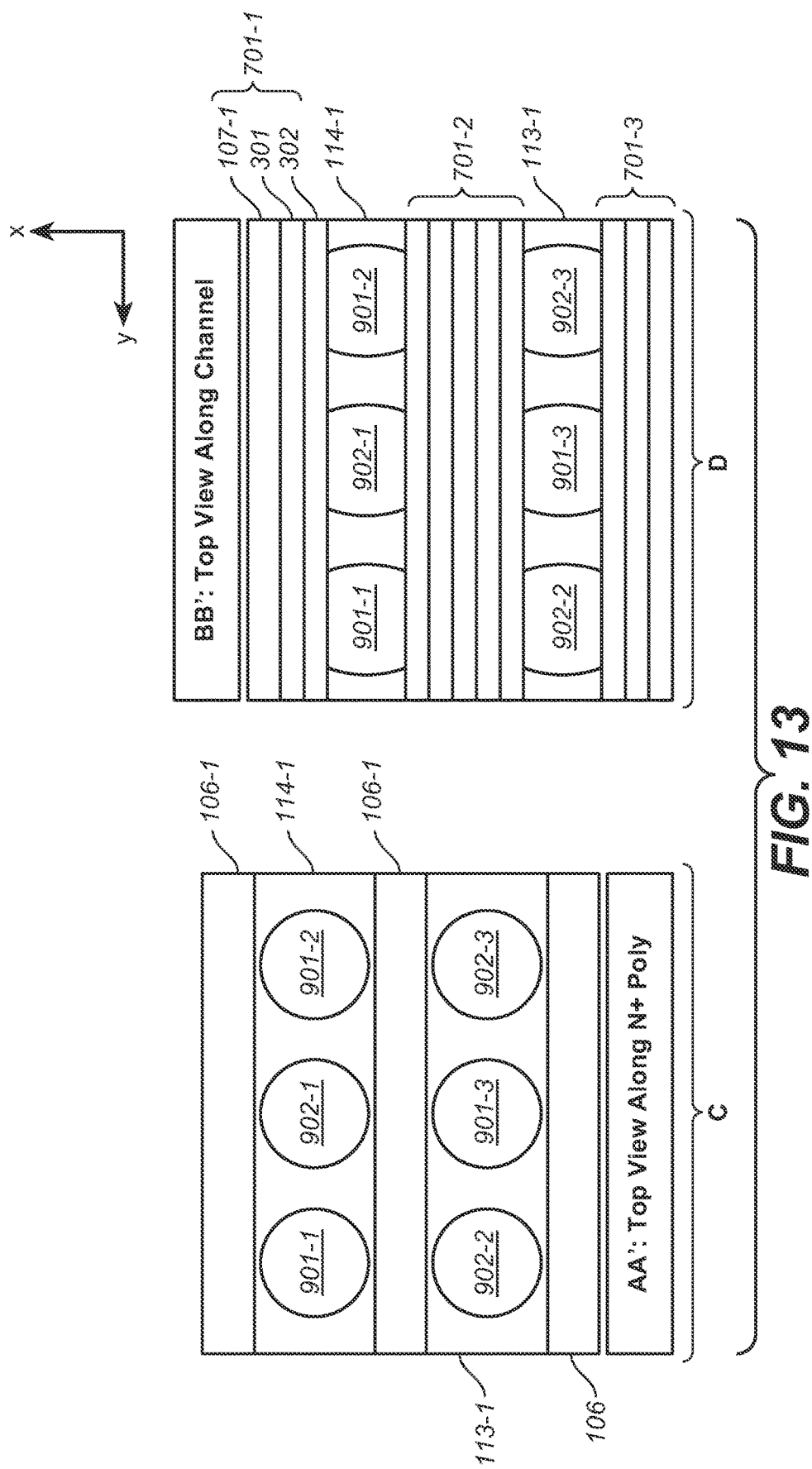
FIG. 13 shows cross sections C and D of semiconductor structure 100 of FIG. 12, after an oxide etch step expands memory holes 901 and 902, in accordance with one embodiment of the present invention.

The SiOC material in memory holes 901 and 902 is then removed by an etch step. FIG. 12 shows cross sections C and D of semiconductor structure 100 of FIG. 11, after removal of the SiOC material from first set of memory holes 901-1 to 901-3 and 902-1 to 902-3, in accordance with one embodiment of the present invention. An oxide recess step is then carried out to expand memory holes 901 and 902. FIG. 13 shows cross sections C and D of semiconductor structure 100 of FIG. 12, after the oxide etch step expands memory holes 901 and 902, in accordance with one embodiment of the present invention. Note that, in both oxide-filled trenches 112 and 114, the X-direction width at cross section D (i.e., cross section through oxide layer 107, channel polysilicon layer 301 and SiGe layer 302) is less than the X-direction width at cross section C (i.e., cross section through N⁺-doped polysilicon layer 106) because of SiGe layers 302. Consequently, the oxide recess steps that expand memory holes 901 and 902 in the X-direction at cross section D reaches SiGe layers 302 before reaching the sidewalls of N⁺-doped polysilicon layer 106 at cross section C. Thus, at cross section D, memory holes 901 and 902 are therefore oval. The oxide recess step may be a time-controlled etch step. The final critical dimensions of memory hole 901 and 902 depend on the etch time.

Figure 14:
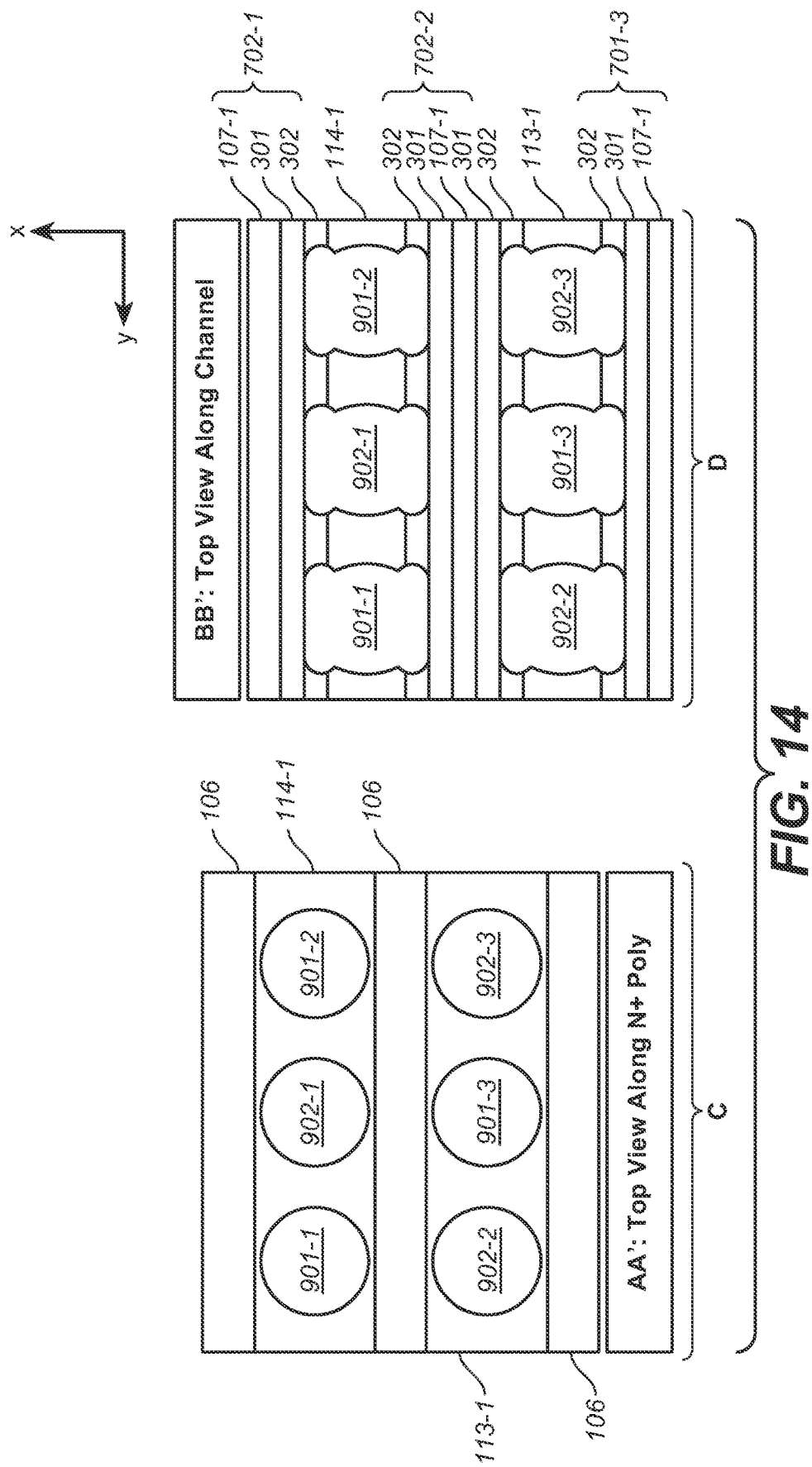
FIG. 14 shows cross sections C and D of semiconductor structure 100 of FIG. 13, after a SiGe etch step removes SiGe at memory holes 901 and 902, thereby exposing channel polysilicon layer 302 underneath, in accordance with one embodiment of the present invention.

A SiGe etch step then breaks through SiGe layer 302 at memory holes 901 and 902 to expose underlying channel polysilicon layer 301. FIG. 14 shows cross sections C and D of semiconductor structure 100 of FIG. 13, after a SiGe etch step removes the SiGe material from memory holes 901 and 902, thereby exposing channel polysilicon layer 302 underneath, in accordance with one embodiment of the present invention.

Figure 15:
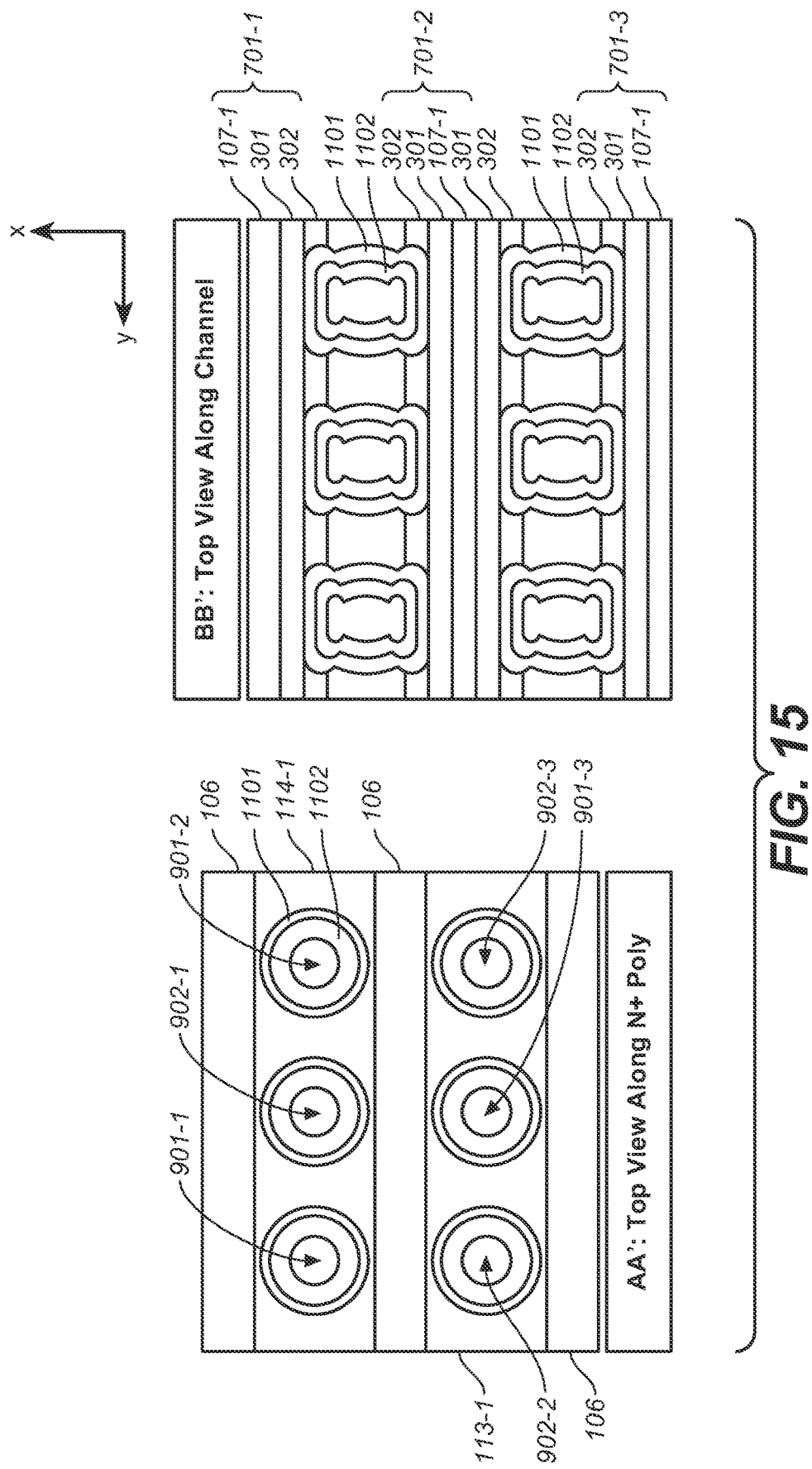
FIG. 15 shows cross sections C and D of semiconductor structure 100 of FIG. 14, after successive conformal depositions of ONOA layer 1101 and polysilicon liner 1102, in accordance with one embodiment of the present invention.

Thereafter, successive depositions of conformal layers of silicon oxide (1101a), silicon nitride (1101b), silicon oxide (1101c) and aluminum oxide (1101d) are carried out to form charge-trapping ("ONOA") layer 1101. Silicon oxide ("tunnel oxide") layer 1101a may be, for example, 1.0-1.5 nm thick. Silicon nitride layer 1101b—which traps charge carriers that tunnel through tunnel oxide 1101a from channel polysilicon 301—may be, for example, 3.0-5.0 nm thick. Silicon oxide layer 1101c and aluminum oxide layer 1101d, which may be ~1.5-4.5 nm and ~1.0-3.0 nm, respectively, form a "blocking" layer. A further sacrificial layer of polysilicon ("polysilicon liner") 1102 may be provided to protect ONOA layer 1101 during the next etch steps. FIG. 15 shows cross sections C and D of semiconductor structure 100 of FIG. 14, after successive conformal depositions of ONOA layer 1101 and polysilicon liner 1102, in accordance with one embodiment of the present invention.

Figure 16:
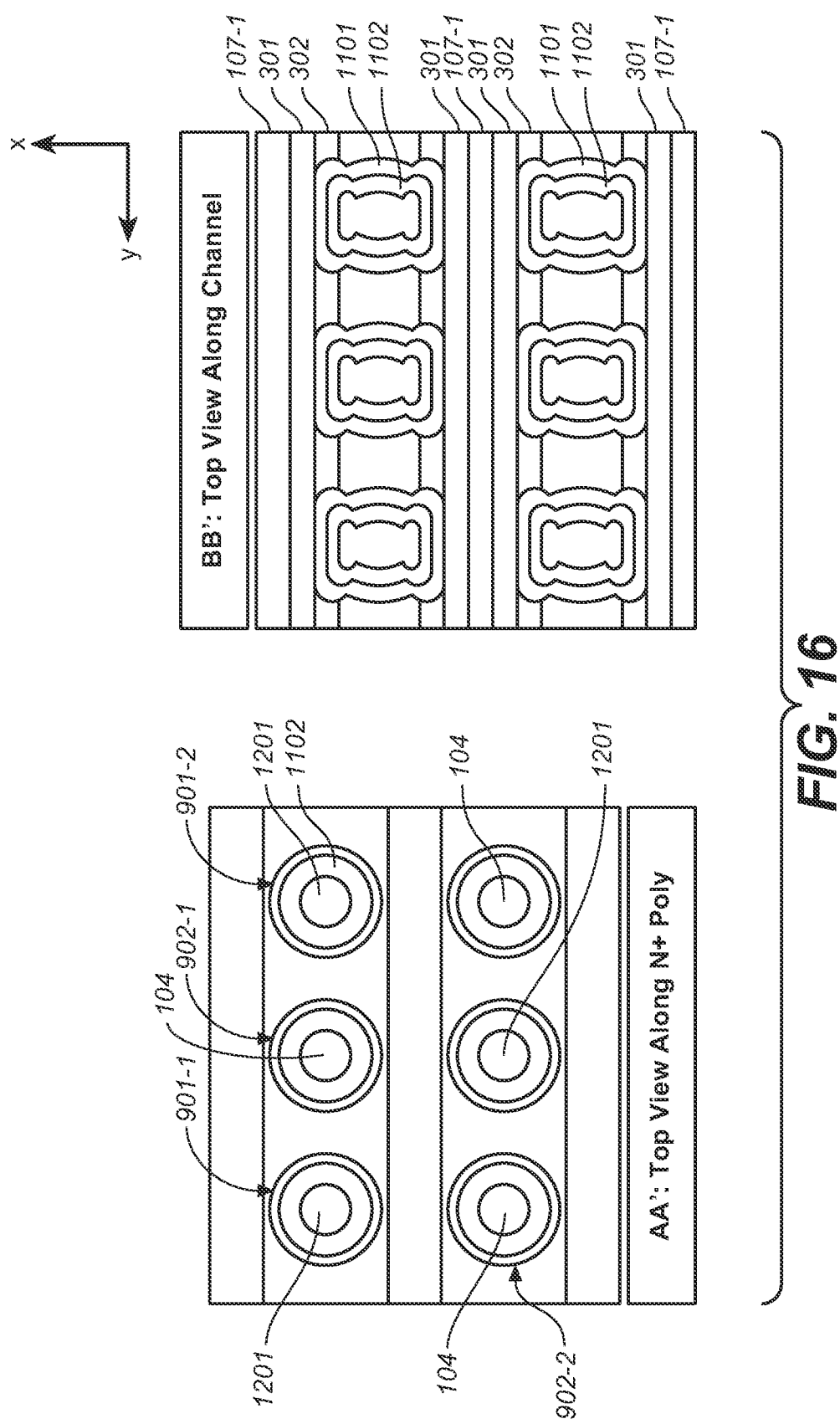
FIG. 16 shows cross sections C and D of semiconductor structure 100 of FIG. 15, after the punch-through etch step exposes conductor-filled vias 1201 at the bottom of memory holes 901, in accordance with one embodiment of the present invention.

An anisotropic etch step removes the portions of ONOA layer 1101 and polysilicon liner 1102 at the bottom of memory holes 901 and 902, thereby exposing etch stop layer 104. In this embodiment, memory holes 901 are provided above conductor-filled vias 1201 that allow electrical connections to selected ones of underlying bottom word lines 102. A punch-through etch step removes etch stop layer 104 at the bottom of memory holes 901, such that the conductor plugs (e.g., tungsten) that are to be subsequently placed in memory holes 901 to serve as local word lines may be voltage-biased from bottom word lines 102. In this embodiment, conductor plugs (e.g., tungsten) in memory holes 902 are provided to serve as local word lines that are voltage-biased from word lines ("top word lines") to be formed above memory structure 100. FIG. 16 shows cross sections C and D of semiconductor structure 100 of FIG. 15, after the punch-through etch step exposes conductor-filled vias 1201 at the bottom of memory holes 901, in accordance with one embodiment of the present invention.

Figure 17:
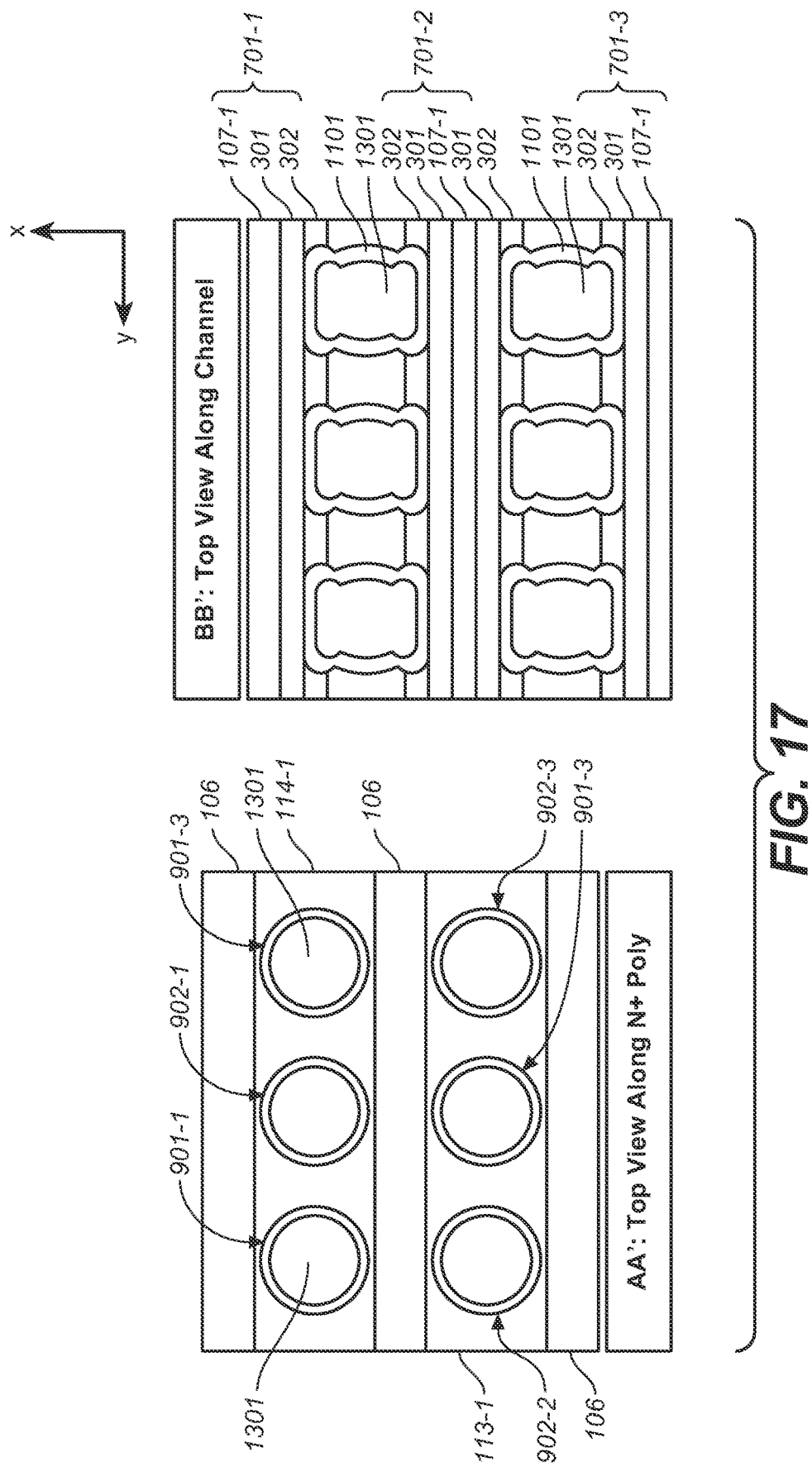
FIG. 17 shows cross sections C and D of semiconductor structure 100 of FIG. 16, after memory holes 901 and 902 are conductor-filled, in accordance with one embodiment of the present invention.

Polysilicon liner 1102 is then removed. A conformal adhesion layer—such as a metal liner (e.g., titanium nitride) layer—is deposited into memory holes 901 and 902, which is followed by a metal filling step (e.g., tungsten). Planarization using a CMP step may then be carried out. FIG. 17 shows cross sections C and D of semiconductor structure 100 of FIG. 16, after memory holes 901 and 902 are conductor-filled and planarized, in accordance with one embodiment of the present invention.

The top word lines and other interconnect layers may then be provided in a conventional manner.

The above detailed description is provided to illustrate specific embodiments of the present invention and is not intended to be limiting. Numerous variations and modifications within the scope of the present invention are possible. The present invention is set forth in the accompanying claims below.

We claim:

1. A process, comprising:
    forming, above a planar surface of a substrate, a structure comprising a plurality of groups of material layers, each group of material layers ("active layer") provided one above another along a first direction substantially orthogonal to the planar surface of the substrate, each active layer including (i) first and second layers of a first material, (ii) a layer of a second material provided between the first and second layers of the first material, and (iii) an isolation layer separating the active layer from an adjacent active layer;
    etching a first set of trenches through the active layers, with each trench running lengthwise along a second direction substantially parallel to the planar surface of the substrate, thereby forming a first plurality of material stacks ("active stacks") out of the structure;
    in each active stack, forming recesses into the layers of the second material by removing a portion of each layer of the second material from sidewalls of the active stack;
    depositing conformally a layer of a third material over the sidewalls of the active stacks;
    depositing a layer of a fourth material over the layer of the third material and filling the recesses;
    etching back the layer of the fourth material to expose the layer of the third material on the sidewalls of the active stacks, while retaining, in each recess of each active stack, a portion of the layer of the fourth material to cover a corresponding portion of the layer of the third material;
    removing exposed portions of the layer of the third material from the side walls of the active stacks;
    filling the first set of trenches by a fifth material.

2. The process of claim 1, wherein the isolation layer comprises silicon oxy-carbide (SiOC).

3. The process of claim 1, wherein the second material comprises a silicon oxide.

4. The process of claim 1, wherein the fifth material comprises the second material.

5. The process of claim 1, wherein the third material comprises a semiconductor material of a first conductivity.

6. The process of claim 5, wherein the first material comprises a semiconductor material of a second conductivity opposite the first conductivity, and wherein the first material having a higher dopant concentration than the third material.

7. The process of claim 5, wherein the fourth material comprises one of: silicon carbon, silicon boron and silicon germanium.

8. The process of claim 7, wherein the third and fourth materials are each first deposited in amorphous form and subsequently crystallized using an anneal step.

9. The process of claim 5, further comprises etching the active layers of the first plurality of active stacks to create a second set of trenches through the active layers of each active stack, with each trench running along the second direction, thereby forming a second plurality of active stacks out of the first plurality of active stacks.

10. The process of claim 9, further comprising, prior to etching the active layers of the first plurality of active stacks, forming pillars of the fifth material, each pillar running through one of the first plurality of active stacks into the substrate.

11. The process of claim 10, wherein, along a third direction substantially orthogonal to both the first direction and the second direction, the pillars are provided in a staggered formation.

12. The process of claim 9, further comprising:
in each active stack of the second plurality of active stacks, forming recesses into the layers of the second material by removing a portion of each layer of the second material from sidewalls of the active stack;
depositing conformally a layer of the third material over exposed sidewalls of the second plurality of active stacks;
depositing a layer of a fourth material over the layer of the third material on the exposed sidewalls of the second plurality of active stacks and filling the recesses in the second plurality of active stacks;
etching back exposed portions of the fourth material to expose the layer of the third material on the sidewalls of the second plurality of active stacks, while retaining, in each recess of each of the second plurality of active stacks, a portion of the layer of the fourth material to cover a corresponding portion of the layer of the third material;
removing exposed portions of the layer of the third material from the side walls of the second plurality of active stacks; and
filling the second set of trenches by the fifth material.

13. The process of claim 12, wherein the first material comprises a sacrificial material, the process further comprising, prior to forming recesses in each active stack of the second plurality of active stacks, replacing the sacrificial material by a semiconductor material of a second conductivity opposite the first conductivity, and wherein the semiconductor material of the second conductivity has a higher dopant concentration than the third material.

14. The process of claim 12, wherein each active layer further comprises, in contact with the first layer of the first material, a layer of a sacrificial material, the process further comprising, prior to forming recesses in each active stack of the second plurality of active stacks, replacing the sacrificial material with a metallic conductor.

15. The process of claim 12, further comprising:
forming a plurality of shafts in the first and second set of trenches, exposing in each shaft the portions of the fourth material; and
removing the portions of the fourth material to expose the corresponding portions of the third material.

16. The process of claim 15, further comprising providing a charge trapping layer on the sidewalls of the shafts.

17. The process of claim 16, further comprising filling the shafts with a conductive material.

18. The process of claim 15, wherein the shafts are formed in successive first and second etch steps, wherein between the first and the second etch steps, the shafts formed in the first etch step are filled with a sacrificial material.

19. The process of claim 18, wherein the sacrificial material comprises silicon oxy-carbide (SiOC).

20. The process of claim 16, further comprising, prior to forming the structure, forming a first plurality of conductors above the planar surface and, subsequent to forming the shafts of the first etch step, (i) excavating selected ones of the shafts to expose selected ones of the conductors, and (ii) filling the shafts with a second plurality of conductors, such that some of the second plurality of conductors contact the exposed ones of the first plurality of conductors.

21. The process of claim 20, wherein the second plurality of active stacks form an HNOR array, with each active layer of each active stack in the HNOR array providing a common source region, a common drain region and a channel region for a plurality of storage transistors formed in the active layer along the second direction.

22. The process of claim 21, wherein the first plurality of conductors provides a network of global word lines and wherein the second plurality of conductors provides a plurality of local word lines for the storage transistors in the HNOR array.

23. The process of claim 1, further comprising providing an etch stop layer between the structure and the planar surface of the substrate.

24. The process of claim 5, wherein the first material comprises a sacrificial material, the process further comprising replacing the sacrificial material by a semiconductor material of a second conductivity opposite the first conductivity, and wherein the semiconductor material of the second conductivity has a higher dopant concentration than the third material.

25. The process of claim 12, wherein each active layer further comprises, in contact with the first layer of the first material, a layer of a sacrificial material, the process further comprising, prior to forming recesses in each active stack of the second plurality of active stacks, replacing the sacrificial material with a metallic conductor.

26. The process of claim 5, further comprising:
forming a plurality of shafts in the trenches, exposing in each shaft the portions of the fourth material; and
removing the portions of the fourth material to expose the corresponding portions of the third material.

27. The process of claim 26, further comprising providing a charge trapping layer on the sidewalls of the active stacks exposed to the shafts.

28. The process of claim 27, further comprising filling the shafts with a conductive material.

29. The process of claim 27, wherein the shafts are formed in successive first and second etch steps, wherein between the first and the second etch steps, the shafts formed in the first etch step are filled with a sacrificial material.

30. The process of claim 29, wherein the sacrificial material comprises silicon oxy-carbide (SiOC).

31. The process of claim 27, further comprising, prior to forming the structure, forming a first plurality of conductors above the planar surface and, subsequent to forming the shafts of the first etch step, (i) excavating selected ones of the shafts to expose selected ones of the conductors, and (ii) filling the shafts with a second plurality of conductors, such that some of the second plurality of conductors contact the exposed ones of the first plurality of conductors.

32. The process of claim 31, wherein the active stacks form an HNOR array, with each active layer of each active stack in the HNOR array providing a common source region, a common drain region and a channel region for a plurality of storage transistors formed in the active layer along the second direction.

33. The process of claim 32, wherein the first plurality of conductors provides a network of global word lines and wherein the second plurality of conductors provides a plurality of local word lines for the storage transistors in the HNOR array.

\* \* \* \* \*